United States Patent [19]

Yamazaki et al.

[11] Patent Number: 5,151,614
[45] Date of Patent: Sep. 29, 1992

[54] CIRCUIT HAVING CHARGE COMPENSATION AND AN OPERATION METHOD OF THE SAME

[75] Inventors: Akira Yamazaki; Masaki Kumanoya; Yasuhiro Konishi; Katsumi Dosaka, all of Hyogo, Japan

[73] Assignee: Mitsubishi Denki Kabushiki Kaisha, Tokyo, Japan

[21] Appl. No.: 725,037

[22] Filed: Jul. 3, 1991

[30] Foreign Application Priority Data

Jul. 13, 1990 [JP] Japan ................................ 2-186503

[51] Int. Cl.$^5$ ............................................ H03K 17/22
[52] U.S. Cl. .................................. 307/272.3; 307/594; 307/597; 307/246; 307/296.5
[58] Field of Search ..................... 307/272.3, 594, 597, 307/246, 296.5

[56] References Cited

U.S. PATENT DOCUMENTS

| 4,520,418 | 5/1985 | Susi | 307/594 |
| 4,649,289 | 3/1987 | Nakano | 307/246 |
| 4,818,904 | 4/1989 | Kobayashi | 307/594 |
| 5,017,803 | 5/1991 | Toshida | 307/594 |
| 5,030,845 | 7/1991 | Love et al. | 307/594 |
| 5,039,875 | 8/1991 | Chang | 307/594 |

FOREIGN PATENT DOCUMENTS

3332701A1 9/1983 Fed. Rep. of Germany .

Primary Examiner—Stanley D. Miller
Assistant Examiner—Scott A. Ouellette
Attorney, Agent, or Firm—Lowe, Price, LeBlanc & Becker

[57] ABSTRACT

A residual charge removing circuit connected to a node in a power-on reset pulse generating circuit for removing positive charges which remain in this node when a power supply is turned off is disclosed. This residual charge removing circuit is formed of two N-channel MOS transistors connected in series between the node and the ground, and one capacitor. Out of the two N-channel MOS transistors, the transistor near the node has a grounded gate. The capacitor is connected between a gate of the transistor, out of the two N-channel MOS transistors, which is distant from the node, and a power supply. The gate of the transistor distant from the node is connected to a connection point between the two N-channel MOS transistors. Therefore, when a supply potential lowers below a threshold voltage Vth of the MOS transistors due to the power-off, the transistor distant from the node is turned off, so that a potential of the connection point becomes −Vth owing to a discharge of negative charges from the capacitor. This turns on the transistor near the node, so that the residual charges in the node are offset by the negative charges in the connection point.

29 Claims, 19 Drawing Sheets

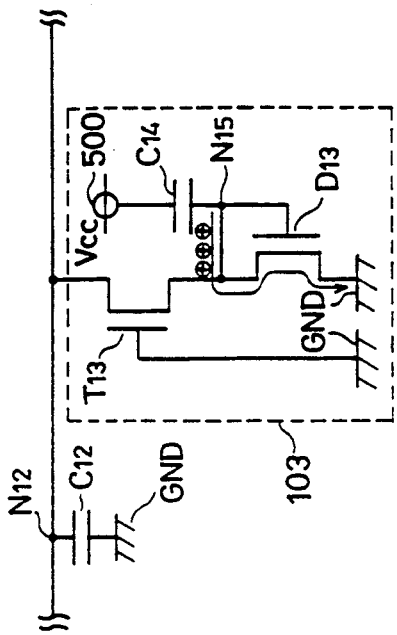
FIG. 8B (WHEN TRANSISTOR D13 IS RENDERED CONDUCTIVE)
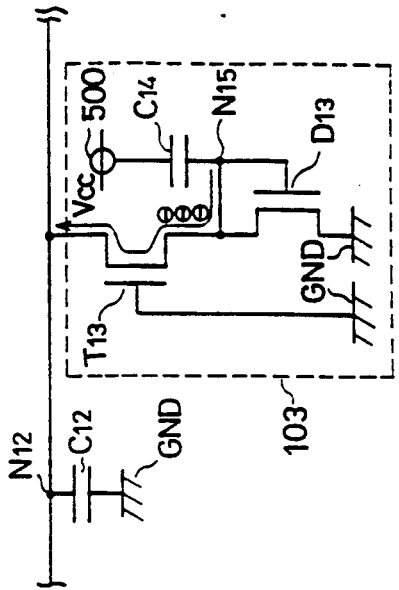
FIG. 8D (AFTER POWER IS CUT OFF)
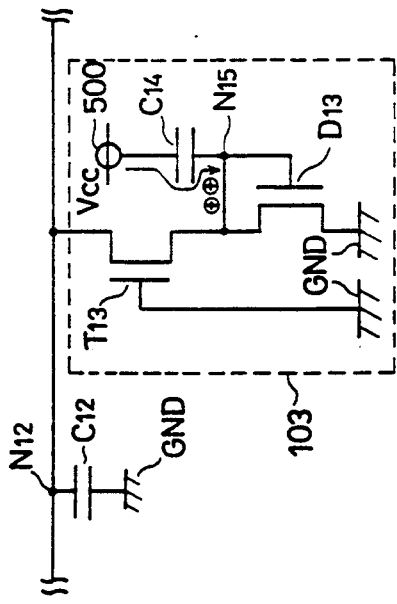
FIG. 8A (WHEN POWER IS TURNED ON)
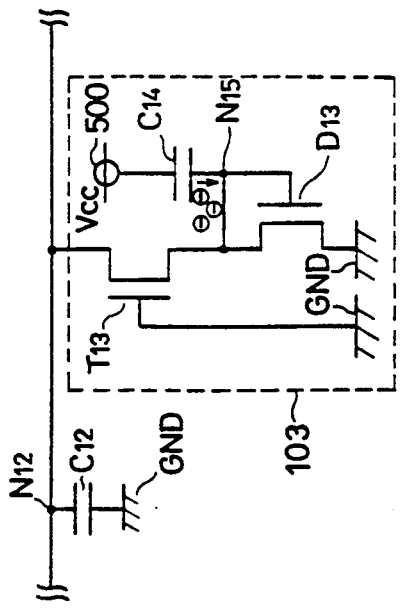
FIG. 8C (WHEN POWER IS CUT OFF)

FIG.16 PRIOR ART
(a) SUPPLY VOLTAGE Vcc
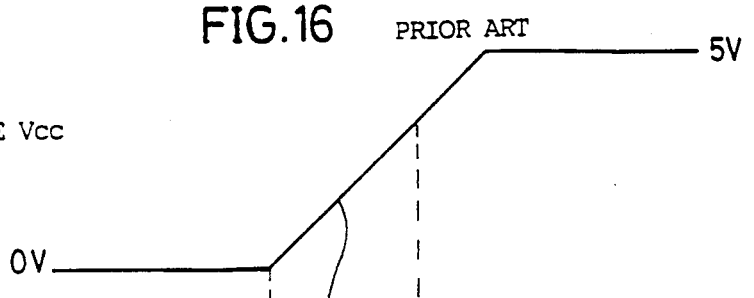
(b) POTENTIAL AT N11
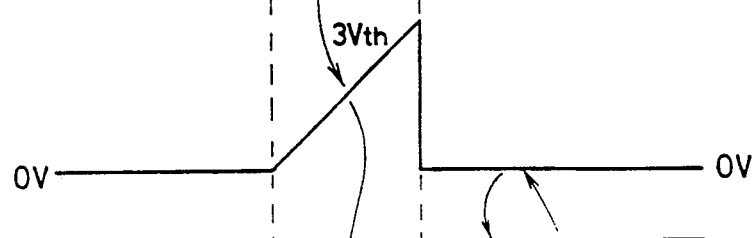
(c) POTENTIAL AT N12
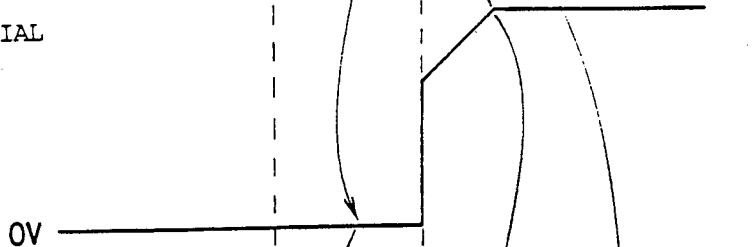
(d) POTENTIAL AT N13
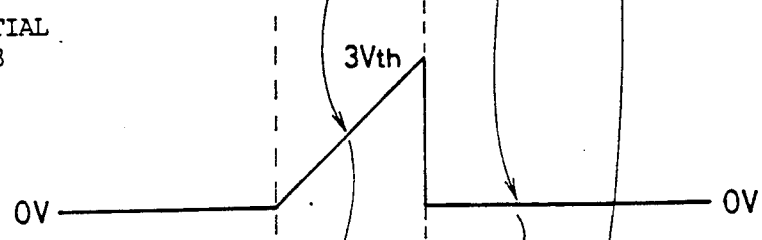
(e) POTENTIAL AT A10
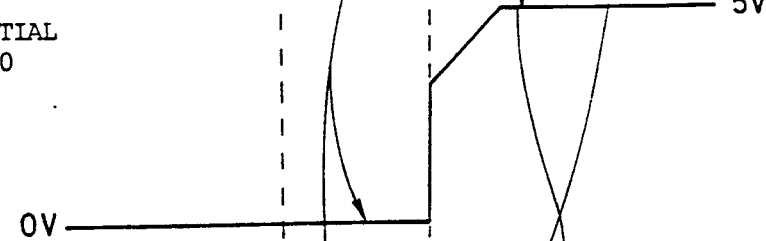
(f) POTENTIAL AT N14
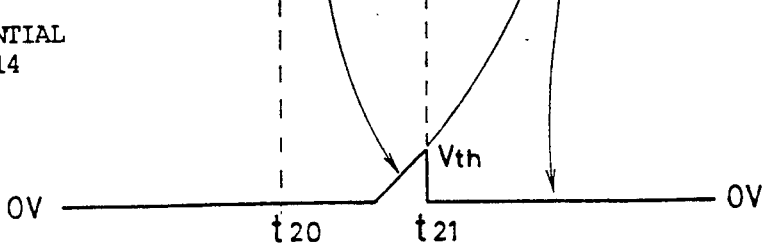

5,151,614

CIRCUIT HAVING CHARGE COMPENSATION AND AN OPERATION METHOD OF THE SAME

BACKGROUND OF THE INVENTION

1. Field of the Invention

The present invention relates generally to residual charge compensation of an electrical circuit and particularly to residual charge compensation of a circuit when operating power is momentarily interrupted.

2. Description of the Prior Art

In recent years, circuits for semiconductor integrated circuit devices have been devised in which a change of a power supply voltage is utilized for generating an output such as a pulse signal. As an example of such circuits, there is a power-on reset pulse generator circuit which detects a rise of the supply voltage above a predetermined voltage at a power-on to generate a signal (power-on reset pulse) for initializing other circuits arranged on a same chip.

FIG. 13 is a block diagram illustrating a semiconductor integrated circuit device provided with a power-on reset pulse generator circuit. Referring to FIG. 13, the power-on reset pulse generator circuit 300 is arranged on the same chip as an internal circuit 400 of the semiconductor integrated circuit device 200. The power-on reset pulse generator circuit 300 and the internal circuit 400 are connected to a power supply terminal 500 for receiving a supply voltage Vcc from an external power supply (not shown).

FIG. 13 shows internal structures of the power-on reset circuit in functional blocks. A coupling circuit 310 couples supply voltage Vcc applied to a supply terminal 500 to an input end of a latch circuit 320. The latch circuit 320 holds two potentials having usually complementary logic levels, corresponding to the potential at the input end. Either of the potentials held in the latch circuit 320 is applied to an output circuit 330 and to a delay circuit 340. Delay circuit 340 provides delay of a prescribed time period to an output signal from the latch circuit 320 and applies the output signal to a forcing circuit 350. The forcing circuit 350 inverts potential of the input end of the latch circuit 320 in response to a first inversion after power-on of an output logic level of the delay circuit 340, and maintains the potential at the inverted level. By the operation of the forcing circuit 350, the output logic level of the latch circuit 320 is kept at the H level or L level for a period of time corresponding to the delay time of the signal in the delay circuit 340, immediately after the power-on. The output circuit 330 converts the output signal from the latch circuit 220 to a signal $\overline{POR}$ or POR which has a logic level enabling initialization of the circuit 400 immediately after the power-on only, and outputs the same.

In this way, the power-on reset pulse generator circuit 300 is responsive to the power-on to generate a signal $\overline{POR}$ or POR for initializing the internal circuit 400. The internal circuit 400 is driven by a supply voltage Vcc supplied from the supply terminal 500, and starts a normal operation after it is initialized while the power-on reset pulse generator circuit 300 is generating the pulse signal $\overline{POR}$ or POR for the initialization. This initialization forces a potential at a predetermined node in the internal circuit 400 to a potential (referred to as an initial potential) to be maintained at the start of the ordinary operation. Therefore, unless the power-on reset pulse generator circuit 300 generates the power-on reset pulse having a sufficient level and width, the above predetermined node in the internal circuit 400 is not sufficiently set at the initial potential, resulting in problems such as a malfunction of the internal circuit 400.

FIG. 9 is an actual circuit diagram illustrating internal structures of the power-on reset pulse generator circuit 300 shown in FIG. 13. The structures and operations of this power-on reset pulse generator circuit will be described hereinafter.

Referring to FIG. 9, this power-on reset pulse generator circuit includes inverters 11 and 12 which form a flip-flop 101, two diode-connected N-channel MOS transistors D11 and D12 which form a MOS diode array 102, a capacitor C11 connected between the flip-flop 101 and the supply terminal 500, and inverters 13 and 14 connected in series between the flip-flop 101 and a POR output terminal A10. This power-on reset pulse generator circuit further includes a capacitor C12 connected between an input terminal of the inverter 12 and the ground GND, an N-channel MOS transistor T12 provided between the capacitor C11 and the ground GND, a capacitor C13 connected in parallel between a gate of the transistor T12 and the ground GND, and an N-channel MOS transistor T11. The MOS diode array 102 is provided between an output terminal of the inverter 14 and the gate of the transistor T12.

Now, operations of this power-on reset pulse generator circuit will be described, assuming that the power supply is turned on when the nodes N11–N14 in this power-on reset circuit have potentials of 0 V (0 volt) owing to sufficient discharge. The following description will be given with reference to FIGS. 10 and 11. FIG. 10 is a circuit diagram more specifically illustrating the structures of the power-on reset pulse generator circuit in FIG. 9. FIG. 11 is a waveform diagram illustrating the operations of the power-on reset pulse generator circuit when each node in the power-on reset pulse generator circuit has the potential of 0 V.

Referring to FIG. 10, the inverters 11–14 are respectively formed of P-channel MOS transistors 110, 120, 130 and 140 which are connected in series between the supply terminal 500 and the ground GND as well as N-channel MOS transistors 111, 121, 131 and 141 which are connected between the supply terminal 500 and the ground GND.

Referring to FIGS. 10 and 11, when the power supply is turned on at a time t20, the supply voltage Vcc ((a) in FIG. 11) rises from 0 V to, e.g., 5 V. In this operation, since the transistor T12 is in an OFF state, the potential ((b) in FIG. 11) of the node N11 rises along with the supply voltage Vcc owing to coupling of the capacitor C11. Meanwhile, the capacitor C12 of the node N12 tends to maintain the potential before the power-on, i.e., of 0 V. Therefore, the flip-flop 101 is set such that the output terminal of the inverter 12 has the potential at the H level.

After power-on, until the potential at the node N11 (FIG. 11(b)) reaches the threshold voltage $V_{th}$ of the transistor 130, the transistor 130 is ON in the inverter 13, and therefore the potential at the node N13 (FIG. 11(d)) rises together with the supply voltage Vcc, in response to the power-on. When the potential at the node N11 exceeds the threshold voltage $V_{th}$, the transistor 130 in the inverter 13 is turned OFF, and in turn, the transistor 131 is turned ON, so that the potential at the node N13 lowers to 0 V. In this manner, the potential at the node N13 rises together with the supply voltage Vcc to the threshold voltage Vth after the power-on, and then returns to 0 V. Therefore, after the power-on, the transistor 140 in the inverter 14 is ON, and hence the potential at the output terminal A10 (FIG. 11(e)) rises together with the supply voltage Vcc.

When the potential at the node N13 is at the L level (=0 V), the transistor T11 is in the OFF state, so that the potential at the node N14 depends on the potential of the output terminal A10. When the potential at the output terminal A10 exceeds a sum (2 Vth) of the threshold voltages Vth of the transistors D11 and D12 which form the diode array 102, both the transistors D11 and D12 are turned on, and accordingly the potential ((f) in FIG. 11) at the node N14 rises to a potential (Vcc−2 Vth) which is lower than the supply voltage Vcc by the threshold voltage (2 Vth) of the diode array 102. When the potential at the node N14 exceeds the threshold voltage Vth of the transistor T12 at the time t21, the transistor T12 is also turned on. Consequently, the charges supplied from the supply terminal 500 to the node N11 owing to the coupling of the capacitor C11 are discharged to the ground GND. This discharge at the node N11 turns on the transistors 110 and 121 in the inverts 11 and 12 of the flip-flop 101, so that the flip-flop 101 is reset. Thus, the potential at the node N12 is set at the H level by the charges supplied to the node N12 from the supply terminal 500 through the transistor 110. In response to the node N11 having the potential at the L level, the transistors 130 and 141 in the inverters 13 and 14 become conductive. Consequently, the potential at the node N13 rises to the potential of the supply voltage Vcc to be set at the H level, and then the potential at the output terminal A10 falls to the ground potential (=0 V). Meanwhile, in response to the output (node N13) of the inverter 13 having the potential at the H level, the transistor T11 becomes conductive and lowers the potential at the node N14 to 0 V. Therefore, the transistor T12 is again set to the OFF state. The potential are the node N11 is, however, maintained at the L level by the transistor 121 in the inverter 12. Accordingly, the potentials at the nodes N12 and N13 are raised to 5 V by the transistors 110 and 130 which are on in accordance with the rise of the supply voltage Vcc, and the potential at the output terminal A10 is fallen to 0 V by the transistor 141 which in on thereafter.

In the power-on reset pulse generator circuit, as described above, if the delay due to the charge and discharge during the change of the potentials at the respective nodes is neglected, the potential at the terminal A10 is kept at the H level for the period of time until the rising supply voltage Vcc exceeds the sum (3 Vth) of the threshold voltage 2 Vth of the diode array 102 and the threshold voltage Vth of the transistor T12, and it falls to the L level when the supply voltage Vcc exceeds 3 Vth thereafter. Thus, the terminal A10 receives the pulse signal at the H level for the predetermined period in response to the power-on. More specifically, it receives a power-on reset pulse POR which is kept at the H level for the predetermined period in response to the power-on.

FIG. 14 is a block diagram showing a structure of a conventional power-on reset pulse generating circuit generating a power-on reset pulse POR of negative polarity, in accordance with the same principle as that of the power-on reset pulse generating circuit shown in FIG. 9.

Referring to FIG. 14, different from the circuit shown in FIG. 9, in this power-on reset circuit, an output of an inverter 11 in a flip flop 101 is input to an inverter 13, an output from the inverter 13 is applied to a diode array 102, and an output of an inverter 14 is input to a gate of a transistor T11.

Now, operations of this power-on reset pulse generator circuit will be described, assuming that the power supply is turned on when the nodes N11–N14 in this power-on reset circuit have potentials of 0 V (0 volt) owing to sufficient discharge. The following description will be given with reference to FIGS. 15 and 16. FIG. 15 is a circuit diagram more specifically illustrating the structure of the power-on reset pulse generator circuit in FIG. 14. FIG. 16 is a waveform diagram illustrating the operations of the power-on reset pulse generator circuit when each node in the power-on reset pulse generator circuit has the potential of 0 V.

Referring to FIGS. 15 and 16, when the power supply is turned on at a time t20, the supply voltage Vcc ((a) in FIG. 16) rises from 0 V to, e.g., 5 V. IN this operation, since the transistor T12 is in an OFF state, the potential ((b) in FIG. 16) of the node N11 rises along with the supply voltage Vcc owing to coupling of the capacitor C11. Meanwhile, the capacitor C12 of the node N12 tends to maintain the potential before the power-on, i.e., of 0 V. Therefore, the flip-flop 101 is set such that the output terminal of the inverter 12 has the potential at the H level.

The node N12 has the potential at an L level ((c) i FIG. 16) when the power supply is turned on. Therefore, the transistor 130 in the inverter 13 is turned on so that the potential ((d) in FIG. 11) of the node N13 rises along with the supply voltage Vcc to the H level in response to the power-on. In response to the potential at the H level at the node N13, the transistor 141 in the inverter 14 is turned on so that the potential ((e) in FIG. 16) at the output terminal A12 is at the L level (=0 V) immediately after the power-on.

When the potential at the output terminal A12 is at the L level the transistor T11 is in the OFF state, so that the potential at the node N14 depends on the potential of the node N13. When the potential at the node N13 exceeds a sum (2 Vth) of the threshold voltages Vth of the transistors D11 and D12 which form the diode array 102, both the transistors D11 and D12 are turned on, and accordingly the potential ((f) in FIG. 16) at the node N14 rises to a potential (Vcc−2 Vth) which is lower than the supply voltage Vcc by the threshold voltage (2 Vth) of the diode array 102. When the potential at the node N14 exceeds the threshold voltage Vth of the transistor T12 at the time t21, the transistor T12 is also turned on. Consequently, the charge supplied from the supply terminal 500 to the node N11 owing to the coupling of the capacitor C11 are discharged to the ground GND. This discharge at the node N11 turns on the transistors 110 and 121 in the inverts 11 and 12 of the flip-flop 101, so that the flip-flop 101 is reset. Thus, the potential at the node N12 is set at the H level by the charges supplied to the node N12 from the supply terminal 500 through the transistor 110. In response to the node N12 having the potential at the H level, the transistors 131 and 140 in the inverters 13 and 14 become conductive. Consequently, the potential at the node N13 is set at the L level, and then the potential at the output terminal A10 rises to the potential of the supply voltage Vcc. In response to the output (output terminal A10) of the inverter 14 having the potential at the H level, the transistor T11 becomes conductive and lowers the potential at the node N14 to 0 V. Therefore, the transistor T12 is again set to the OFF state. The potential at the node N11 is, however, maintained at the L level by the transistor 121 in the inverter 12. Accordingly, the potentials at the node N12 and the output terminal A10 are raised to 5 V by the transistors 110 and 140 which are on in accordance with the rise of the supply voltage Vcc.

in the power-on reset pulse generator circuit, as described above, if the delay due to the charge and discharge during the change of the potentials at the respective nodes is neglected, the potential at the terminal A10 is kept at the L level for the period of time until the rising supply voltage Vcc exceeds the sum (3 Vth) of the threshold voltage 2 Vth of the diode array 102 and the threshold voltage Vth of the transistor T12, and it rises to the H level when the supply voltage Vcc exceeds 3 Vth thereafter. Thus, the terminal A10 receives the pulse signal at the L level for the predetermined period in response to the power-on. More specifically, it receives an inverted signal $\overline{POR}$ of the power-on reset pulse POR which is kept at the H level for the predetermined period in response to the power-on.

The signal $\overline{POR}$ (or POR) introduced to the output terminal A10 in FIGS. 9 and 14 is used to reset the unstable nodes, which have a possibility to be at either the H level or the L level after the power-on, to the predetermined levels.

The power-on reset pulse generator circuits described above are typical examples of the conventional circuits utilizing the change of the supply voltages, and they are formed without taking residual charges at the power-off into consideration. Therefore, these residual charges adversely affect such circuits to cause the malfunction, and thus adversely and seriously affect the semiconductor integrated circuit devices including these circuits.

Referring to FIGS. 10 and 15, the operation principle of the conventional power-on reset pulse generator circuits is based on the assumption that the potentials at all the nodes in the power-on reset pulse generator circuit are of 0 V before the power-on. However, the power supply may be continuously and repetitively turned on and off, e.g., for the function test of the semiconductor integrated circuit device, or the power supply may momentarily turned off due to power failure. In these cases, the period between the power-off and the next power-on is extremely short. In such cases, the electrical charges in ones of the nodes in the power-on reset pulse generator circuit are not fully discharged, so that such a phenomenon has actually occurred that the potential in the node to be of 0 V may be shifted to the positive or negative at the next power-on. The phenomenon causes the problem as described above. This problem will be specifically described below with reference to, for instance, the power-on reset pulse generator circuits in FIG. 10 and 15.

First, this problem will be described with reference to the power-on reset pulse generator circuit in FIG. 10. In the following, reference is also made to FIG. 12, which is a waveform diagram illustrating the potential changes at the output terminal A10 and the nodes N11-N14 after the power-on when the residual charges at the last power-off have remained in the power-on reset pulse generator circuit in FIG. 10.

Referring to FIGS. 10 and 12, before a power-off time t22, the nodes N11 and N14 and the output terminal A10 have the potentials of 0 V as indicated by (b), (f) and (e) in FIG. 12, respectively, and the potentials at the node N14 and the node N13 are the supply voltage of 5 V as indicated by (c) and (d) in FIG. 12, respectively. When the power is turned off at the time t22, the supply voltage Vcc decreases from 5 V toward 0 V as indicated by (a) in FIG. 12. For the period before the time t23 at which the supply voltage Vcc lowers to the threshold voltage Vth of the MOS transistor, the potentials at the node N12 and the node N13, which have been held at the H level before the power-off, lower in accordance with the lowering of the supply voltage Vcc owing to the ON state of the transistors 110 and 130, respectively. (See (c) and (e) in FIG. 12.)

After the time t23, the supply voltage Vcc further decreases below the threshold voltage Vth of the MOS transistor toward 0 V, in which case all of the transistors in FIG. 10 are turned off. Therefore, at the time t24 when the supply voltage Vcc lowers completely to 0 V, the potential at the node N11 lowers to −Vth owing to the negative charges supplied from the capacitor C11 to the node N11. Meanwhile, the potentials at the nodes N12 and N13 lower along with the supply voltage Vcc owing to the turned on transistor 110 and 130, respectively, until the time t23 at which the supply voltage Vcc lowers to the threshold voltage Vth of the MOS transistor. However, when all the transistors connected to the nodes N12 and N13 are turned off at the time t23, discharge paths for the charges from the respective nodes N12 and N13 are electrically cut. Therefore, for the period from the time t23 to the time 24, the potential in the node N13 is held at the potential Vth, and the discharge does not occur in the capacitor C12 so that the potential in the node N12 is also held at the potential Vth which was maintained at the time t23. Thus, the positive charges remain in the node N12.

For the period from the time t24 to the time t25 at which the power supply is turned on again, the negative and positive charges which have remained at the node N11 and the nodes N12 and N13 are gradually discharged due to a junction leak. Therefore, if there is a sufficiently long period between the power-off time t24 and the next power-on time t25, the potentials at the nodes N11, N12 and N13 return to 0 V.

However, if the period between the times t24 and t25 is relatively short, the residual charges in the nodes N11, N12 and N13 are scarcely discharged. Therefore, when the power supply is turned on again immediately after the power-off, the potentials at the node N11 and the nodes N12 and N13 at this power-on are the same as the potentials −Vth and Vth at the power-off. Thus, when the power supply is turned on again at the time t25, the potential in the node N11 is raised in accordance with the rise of the supply voltage Vcc by the positive charges which are supplied from the supply terminal 500 to the node N11 owing to the coupling of the capacitor C11. When the supply voltage Vcc reaches the threshold voltage Vth of the MOS transistor at the time t26, the potential at the node N11 returns to 0 V.

Therefore, the potential at the node N13 is kept fixed at the voltage Vth which is the potential at the power-on, from T25 to T26, since the transistor 130 in the inverter 13 is kept ON due to the low potential at the node N11.

Meanwhile, the transistor 110 in the inverter 11 is in the ON state due to the lower potential at the node N11, so that the potential at the node N12 is substantially fixed at the potential Vth as at the power-on, for the period from the time t25 to the time t26. Thus, the potential at the input terminal N11 of the flip-flop 101 is set lower than the potential at the output terminal N12 in the flip-flop 101 at the time t26. This means that the transistor 110 in the inverter 11 is turned on and the transistor 121 in the inverter 12 is turned on. Thus, the flip-flop 101 is set such that the potential at the node N12 attains to the H level in a similar manner as that at the power-off. Therefore, after the time t26, the potential at the node N12 is raised in accordance with the supply voltage Vcc by the positive charges supplied by the transistor 110 from the supply terminal 500 to the node N12. When the potential at the node N12 rises to be higher than the threshold voltage Vth, the transistor 121 in the inverter 12 is rendered conductive. Therefore, the potential at the node N11 is fixed at 0 V regardless of the rise of the supply potential Vcc after the time t26 when the potential at the node N12 reaches the threshold voltage Vth (see FIG. 12(b)). Therefore, after the time of power-on t25, the transistor 130 is kept ON in the inverter 13, and therefore, the potential at the node N13 rises from the threshold voltage Vth following the supply voltage Vcc after the time t26, as shown in FIG. 12(d). In the period until the potential at the node N13 exceeds the threshold voltage $V_{th}$ (from t25 to t26), the transistor 140 in the inverter 14 is ON, and therefore the potential at the output terminal A10 rises following the supply voltage Vcc. However, after the time t26 when the potential of the node N13 exceeds the threshold voltage $V_{th}$, the transistor 141 in the inverter 14 is ON, and therefore the potential at the output terminal A10 is fixed at the ground potential 0 V.

In the period from t25 and t26 while the potential at the node N13 is not higher than the threshold voltage $V_{th}$, the potential at the node N14 depends on the potential of the output terminal A10. However, the potential at the output terminal A10 does not exceed the sum 2 Vth of the threshold voltages of the transistors T11 and T12 in this period. Therefore, the potential at the node N14 in this period is 0 V, which is the same as the potential at the time t25 of power-on. Therefore, the potential of the node N14 is kept at the same potential 0 V at the time of power-on, in the period from t25 and t26 and in the period after the time t26 while the transistor T11 is ON (the potential at the node N13 is higher than the threshold voltage $V_{th}$) (see FIG. 12(f)). Therefore, the transistor t12 is kept always OFF after the time t25 when the power is turned on again, and the potential of the node N11 changes dependent only on the potential of the node N12 after the time t25.

As described above, if the potential at the node N12 has not been sufficiently lowered to 0 V but kept at about the threshold voltage $V_{th}$ of the transistor 121 at the time of power-on, the potential at the node N11 soon exceeds the threshold voltage $V_{th}$ after the power-on, and accordingly, the potential at the output terminal A10 returns to the L level after the time of power-on t25 before it rises sufficiently, that is, when it reached the threshold value $V_{th}$. The waveform represented by a chain dotted line in FIG. 12(e) shows the waveform of the signal which should be provided at the output terminal A10. Thus, the power-on reset pulse POR having a sufficient pulse width will not be introduced to the output terminal A10 in response to the power-on. Meanwhile, each of the P-channel and N-channel MOS transistors in the MOS semiconductor integrated circuit device does not operate if the supply voltage Vcc is less than the threshold voltage Vth of these MOS transistors. Therefore, if the power-on reset pulse is not output after the time t26, the internal circuit 400 (FIG. 13) in the semiconductor integrated circuit device will not be initialized. Thus, in the power-on reset pulse generator circuit in the prior art, if the period from the power-off and the next power-on is short, the output from the power-on reset pulse generator circuit have already started to rise at the time t26 when the internal circuits 400 in FIG. 13 starts to operate, after the next power-on. Consequently, the internal circuit 400 is not fully initialized, which causes the malfunction of the internal circuit 400.

Next, such a problem will be specifically described below with reference to the power-on reset pulse generator circuit in FIG. 15. In the following, reference is also made to FIG. 17, which is waveform diagram illustrating the potential changes at the output terminal A10 and the nodes N11-N14 after the power-on when the residual charges at the last power-off have remained in the power-on reset pulse generator circuit in FIG. 15.

Referring to FIGS. 15 and 17, before a power-off time t22, the nodes N11, N13 and N14 have the potentials of 0 V as indicated by (b), (d) and (f) in FIG. 17, respectively, and the potentials at the node N14 and the output terminal A10 are the supply voltage of 5 V as indicated by (c) and (e) in FIG. 17, respectively. When the power is turned off at the time t22, the supply voltage Vcc decreases from 5 V toward 0 V as indicated by (a) in FIG. 17. For the period before the time t23 at which the supply voltage Vcc lowers to the threshold voltage Vth of the MOS transistor, the potentials at the output terminal A10 and the node N12, which have been held at the H level before the power-off, lower in accordance with the lowering of the supply voltage Vcc owing to the ON state of the transistors 110 and 140, respectively. (See (c) and (e) in FIG. 17.)

After the time t23, the supply voltage Vcc further decreases below the threshold voltage Vth of the MOS transistor toward 0 V, in which case all the transistors in FIG. 15 are turned off. Therefore, at the time t24 when the supply voltage Vcc lowers completely to 0 V, the potential at the node N11 lowers to −Vth owing to the negative charges supplied from the capacitor C11 to the node N11. Meanwhile, the potential at the node N12 lowers along with the supply voltage Vcc owing to the turned on transistor 110 until the time t23 at which the supply voltage Vcc lowers to the threshold voltage Vth of the MOS transistor. However, when all the transistors connected to the node N12 are turned off at the time t23, a discharge path for the charges from the node N12 is electrically cut. Therefore, for the period from the time t23 to the time 24, the discharge does not occur in the capacitor C12 so that the potential in the node N12 is held at the potential Vth which was maintained at the time t23. Thus, the positive charges remain in the node N12.

For the period from the time t24 to the time t25 at which the power supply is turned on again, the negative and positive charges which have remained at the nodes N11 and N12 are gradually discharged due to a junction leak. Therefore, if there is a sufficiently long period between the power-off time t24 and the next power-on time t25, the potentials at the nodes N11 and N12 return to 0 V.

However, if the period between the times t24 and t25 is relatively short, the residual charges in the nodes N11 and N12 are scarcely discharged. Therefore, when the power supply is turned on again immediately after the power-off, the potentials at the nodes N11 and N12 at this power-on are the same as the potentials $-V_{th}$ and $V_{th}$ at the power-off. Thus, when the power supply is turned on again at the time t25, the potential in the node N11 is raised in accordance with the rise of the supply voltage Vcc by the positive charges which are supplied from the supply terminal 500 to the node N11 owing to the coupling of the capacitor C11. When the supply voltage Vcc reaches the threshold voltage Vth of the MOS transistor at the time t26, the potential at the node N11 returns to 0 V. Meanwhile, the transistor 110 in the inverter 11 is in the ON state due to the lower potential at the node N11, so that the potential at the node N12 is substantially fixed at the potential Vth as at the power-on, for the period from the time t25 to the time t26. Thus, the potential at the input terminal N11 of the flip-flop 101 is set lower than the potential at the output terminal N12 in the flip-flop 101 at the time t26. This means that the transistor 110 in the inverter 11 is turned on and the transistor 121 in the inverter 12 is turned on. Thus, the flip-flop 101 is set such that the potential at the node N12 attains to the H level in a similar manner as that at the power-off. Therefore, after the time t26, the potential at the node N12 is raised in accordance with the supply voltage Vcc by the positive charges supplied by the transistor 110 from the supply terminal 500 to the node N12. When the potential at the node N12 rises to or above the threshold voltage Vth, the transistor 131 in the inverter 13 becomes conductive. However, since the potential at the node N13 is of 0 V at the power-on time t25, the potential at the node N13 is always of 0 V after the time t25 as indicated by (d) in FIG. 17. Therefore, the time 26 when the supply voltage Vcc reaches the threshold voltage Vth, the transistor 140 in the inverter 14 becomes conductive. Therefore, at the time t26, the potential at the output terminal A10 becomes the potential Vth which is the same as the supply voltage Vcc, and rises to 5 V in accordance with the rise of the supply voltage Vcc thereafter. When the potential at the output terminal A10 reaches the threshold voltage Vth at the time t26, the transistor T11 becomes conductive. However, since the potential at the node N14 has been maintained at 0 V after the power-off time t22, it is kept at 0 V even after the time t26 no matter whether the transistor T11 is turned on or off. (See (f) in FIG. 17.)

FIG. 17(e) shows, by a chain dotted line, a signal waveform which should appear at the output terminal A10.

As described above, if the potential at the node N12 is not lowered to 0 V but is maintained approximately at the threshold voltage Vth of the transistor 131, the potential at the output terminal A10 attains to the L level only for a very short period from the power-on time t25 to the time t26 at which the supply voltage Vcc rises to the threshold voltage Vth, and will always be kept at the H level for the period after the time t26. Thus, the power-on reset pulse $\overline{POR}$ having a sufficient pulse width will not be introduced to the output terminal A10 in response to the power-on. Therefore, the same problem as that described with reference to the power-on reset pulse generator circuit in FIG. 10 also occurs, in the power-on reset pulse generator circuit in FIG. 15.

When the power is turned on again, the flip flop 101 should be set in a direction allowing the output potential of the inverter 12 to attain the H level, in order to solve this problem, and therefore, the potential at the node N12 when the power is turned on again must not be higher than the potential (=0 V) of the node N11 when the power is turned on again.

Thus, in order to solve these problems, there has been used such a method that the node N12 in which the charges remain after the power-off is grounded through a resistor. In this method, however, if a resistance of the above resistor is excessively small, a through current always flows from the node N12 toward the ground, so that the semiconductor integrated circuit device has a large consumption current. In order to avoid this, it is necessary to increase the resistance of the above resistor to some extent while maintaining it in a range which allows sufficient extraction of the residual charges from the node N12. However, when forming the resistor element on the semiconductor substrate, the resistor element having a larger resistance requires a larger layout pattern for the resistor element. Accordingly, this method for removing the residual charges disadvantageously increases the consumption power and impedes the high integration of the semiconductor integrated circuit. Further, according to this method, the potential at the node N12 when the power is turned on again is set to 0 V at the lowest, which is the potential at the node N11 when the power is turned on again. However, in order to ensure setting of the flip flop 101 in the direction allowing the output voltage of the inverter 12 to attain the H level, larger difference between the potential at the node N12 and the potential at the node N11 is preferred. If this difference becomes smaller, it becomes more difficult for the inverter 11 to determine the potential at the node N11 as the H level, and similarly, it becomes more difficult for the inverter 12 to determine the potential of the node N12 as the L level. Therefore, the above described method is not fully reliable, since there is a question whether or not the flip flop 101 is surely set to the direction allowing the output potential of the inverter 12 to attain the H level when the power is turned on again.

Another method of the prior art preventing the potential of the node N12 where charges remain after the turn off of the power, from being higher than 0 V when the power is turned on again is as follows. This method will be described with reference to FIGS. 18(a) and 18(b). Referring to FIGS. 18(a) and 18(b), in this method, a discharging circuit is connected to the node N12 where charges remain. FIGS. 18(a) and 18(b) are block diagrams showing the structure of the discharging circuit.

The discharging circuit 104 comprises, as shown in FIG. 18(a), an N channel MOS transistor T14 connected between the node N12 and the ground GND, a P channel MOS transistor T15 at a capacitor C15 connected in series to each other between a supply terminal 500 and the ground GND. A node N16 between the transistor T15 and the capacitor C15 is connected to the gates of the transistors T14 and T15. As shown in FIG. 18(b), the transistor T15 may be replaced by an N channel MOS transistor T16. In such case, the gate of the transistor T16 is connected to the supply terminal 500. The operation of the discharging circuit 104 will be described with reference to FIG. 19. FIG. 19 is a diagram of waveforms showing changes of the potential at the node N16 and the supply voltage Vcc.

When the power is turned on at t0, the supply voltage Vcc (FIG. 19(a)) begins to rise to 5 V. The potential at the node N16 is 0 V at t0, and when the supply voltage Vcc reaches the threshold voltage $V_{th}$ of the MOS transistor at the time t1, the transistor T15 is rendered conductive in the discharging circuit 104 of FIG. 18(a), and the transistor T16 is rendered conductive in the discharging circuit 104 of FIG. 18(b). Consequently, the potential at the node N16 attains to the threshold voltage $V_{th}$ which is the supply voltage Vcc at the time t1, and thereafter, it rises following the supply voltage Vcc. However, since both transistors T15 and T16 have their gates and drains (or sources) connected to each other, the potential at the node N16 is fixed at a potential (Vcc−$V_{th}$) which is lower than the supply voltage Vcc by the threshold voltage $V_{th}$, when the supply voltage Vcc has reached the maximum value 5 V. After the time t1, when the potential at the node N16 exceeds the threshold voltage $V_{th}$, the transistor T14 is rendered conductive in response thereto, and therefore the node N12 is electrically connected to the ground GND through the transistor T14.

When the power is turned off at the time t2, the supply voltage begins to lower from 5 V. However, since the capacitor C15 serves to maintain the potential of the node N16 as it is, and discharge from the node N16 is caused only by a so called junction leak from the source drain regions of transistors T15 and T16 connected thereto, the potential at the node N16 is not abruptly decreased after the time t2 at which the power is turned off, but it is kept approximately at the potential (Vcc−$V_{th}$) which is higher than the threshold voltage $V_{th}$ (see FIG. 19(b)) Therefore, after the power is turned off, the transistor T14 is kept ON. Therefore, the node N12 is kept electrically connected to the ground GND from the time t1 when the supply voltage Vcc reaches the threshold voltage $V_{th}$ until after the time t2 when the power is turned off. Charges left at the node N12 when the power is turned off are discharged to the ground GND, and accordingly, the potential at the node N12 when the power is turned on again will not be higher than 0 V.

However, even in this method, the node N12 where the charges remain is kept electrically connected to the ground GND immediately after turning on of the power until the turning off of the power, causing a through current whose magnitude is dependent on the ON resistance value of the transistor T14, flowing constantly from the node N12 to the ground GND. In addition, the potential of the node N12 is decreased to the ground potential 0 V at the lowest after the turning off of the power.

Therefore, even in this method, the problem of larger power consumption occurs as in the above described method, and the reliability in properly setting the flip flop 101 of FIGS. 10 and 15 when the power is turned on again can not be very much improved.

The principle the power-on reset pulse generator circuits shown in FIGS. 9 and 10 is disclosed in U.S. Pat. No. 4,818,904. The capacitor C11, the flip flop 101, the inverters 13 and 14, the diode array 102, and the transistors T11 and T12 in the power-on reset pulse generating circuit shown in FIGS. 9 and 14 correspond to the coupling circuit 310, the latch circuit 320, the output circuit 330, the delay circuit 340 and the forcing circuit 350 shown in FIG. 13, respectively.

SUMMARY OF THE INVENTION

Accordingly, it is an object of the invention to provide a circuit device in which the malfunction is not caused by residual charges generated at the power-off.

It is another object of the invention to provide a semiconductor integrated circuit device capable of removing the residual charges generated at the power-off without increasing the power consumption.

It is still another object of the invention to provide a semiconductor integrated circuit device capable of removing the residual charges generated at the power-off without impeding the high integration of an internal circuit.

It is yet another object of the invention to provide a semiconductor integrated circuit device having a residual charge removing circuit capable of removing the residual charges generated at the power-off, which may cause a malfunction of an internal circuit, without disadvantages such as increase of the power consumption and the impediment to the high integration.

It is still further object of the invention to achieve correct operation of a circuit such as a power-on reset pulse generator circuit, which is adapted to generate a pulse signal and/or others utilizing a change of a supply voltage, without being affected by the residual charges generated at the power-off.

It is additional another object of the invention to remove the residual charges remaining at a node in a circuit such as a power-on reset pulse generator circuit at the power-off, which is adapted to generate a pulse signal and/or others utilizing a change of a supply voltage, by a method other than that using a mere resistor by a transistor element, a resistor element and the like.

A still further object of the present invention is to set potential at power-on of a node where charges remain when the power is turned off, at a potential lower than 0 V.

In order to achieve the above objects, a semiconductor integrated circuit device according to the invention comprises a second node connected to an arbitrary circuit having a first node which is coupled to a power supply and at which charges of a first polarity remain when the power supply is turned off; a charge supply circuit which supplies charges of a second polarity opposite to the first polarity to the second node in response to the turn-off of the power supply; and a connection circuit for electrically interconnecting the first and second nodes in response to the turn-off of the power supply.

The connector circuit includes a first field effect semiconductor element which has a control terminal connected to a reference potential source, a first conductor terminal connected to the first node, and a second conductor terminal. The supply circuit includes a second field effect semiconductor element which has a first conductor terminal connected to the second node, a second conductor terminal connected to the reference potential source and a control terminal connected to the second node, and a first capacitor connected between the control terminal of the power supply and the second field effect semiconductor element. The amount of the charges of the first polarity is preferably equal to or less than that of the charges of the second polarity.

In the semiconductor integrated circuit device thus constructed in accordance with the invention, when the power supply is turned off, the charges having the polarity opposite to that of the residual charges in the arbitrary circuit are supplied to a connection point between the first capacitor and the second field effect semiconductor element, and the first field effect semiconductor element becomes conductive. The first field effect semiconductor element is provided between the arbitrary circuit and the connection point between the first capacitor and the second field effect semiconductor element. Therefore, the residual charges in the arbitrary circuit is canceled by the charges supplied to the above described connection point.

In a preferred embodiment, the first and second field effect semiconductor elements are formed of N-channel MOS transistors, low potential source such as the ground is used as the reference potential source, and the above described arbitrary circuit is a power-on reset pulse generator circuit which is adapted to generate a reset pulse for resetting other predetermined circuit(s) in response to the power-on. The power-on reset pulse generator circuit may have conventional structures.

Specifically, the power-on reset pulse generator circuit may include a third node, a second capacitor connected between the power supply and the third node, a flip-flop provided between the second and third nodes, a third capacitor provided between the second node and the low potential source, a first inverter for inverting a potential at the second node, and a potential forcing circuit for forcing a potential at the third node to a low potential in response to a rise of an output from the first inverter.

The flip-flop includes a second inverter for inverting the potential at the third node and applying the inverted potential to the first node and a third inverter for inverting the potential at the first node and applying the inverted potential to the third node. The potential forcing circuit may include a first N-channel MOS transistor which is connected in series between the third node and the lower potential source and has a gate for receiving the output from the first inverter. Two N-channel MOS transistors, which are individually diode-connected and connected in series to each other, are arranged between the gate of the first N-channel MOS transistor and the output of the first inverter so as to transmit the rise of the output potential of the first inverter to the gate of the first N-channel MOS transistor at a delay of a predetermined time. A fourth capacitor and the second N-channel MOS transistor are connected in parallel between the gate of the first N-channel MOS transistor and the low potential source. The second N-channel MOS transistor receives at its gate an output from a fourth inverter provided for inverting the output from the first inverter.

Accordingly, the present invention enables the sufficient extraction of the charges at an arbitrary node, in which the charges tend to remain at the power-off, without increasing a power consumption and an of a circuit connected to the arbitrary node area. Therefore, by applying the invention to the power-on reset pulse generator circuit, for instance, a correct power-on reset pulse can be stably obtained even if a period from the power-off to the next power-on is short, with the area and power consumption of the power-on reset pulse generating circuit less than those in the prior art. Consequently, it is possible to surely prevent the malfunction of the circuit to be initialized by this power-on reset pulse generator circuit, as compared with the prior art. Thus, the present invention can improve the reliability of the semiconductor integrated circuit device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8A to 8D are model diagrams for illustrating charge flow in a residual charge removing circuit according to the invention;

FIG. 16 is a waveform diagram for illustrating operations of a power-on reset pulse generator circuit in FIGS. 14 and 15;

DESCRIPTION OF THE PREFERRED EMBODIMENTS

Figure 1:
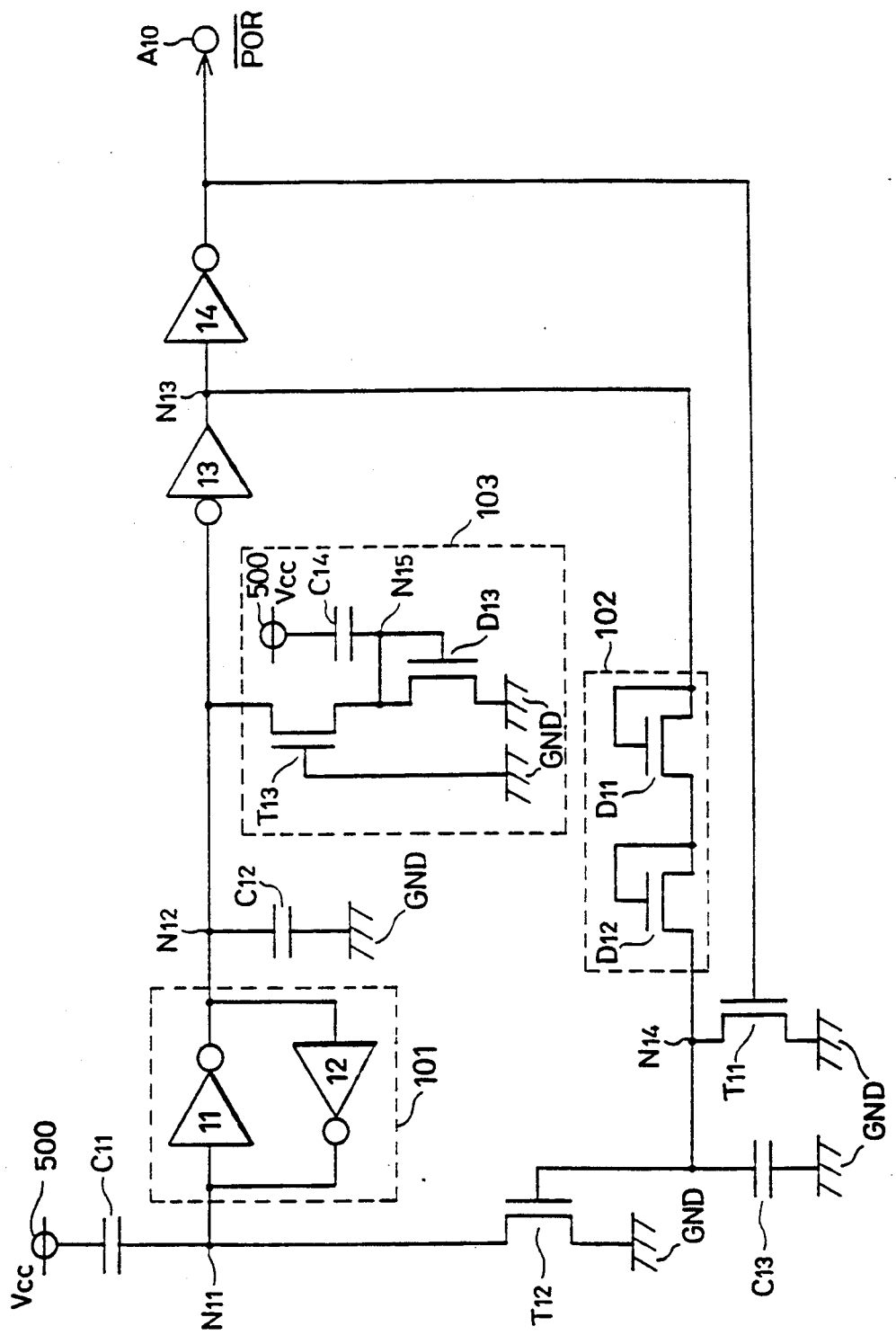
FIG. 1 is a circuit diagram illustrating structures of a power-on reset pulse generator circuit according to an embodiment of the invention.
Figure 10:
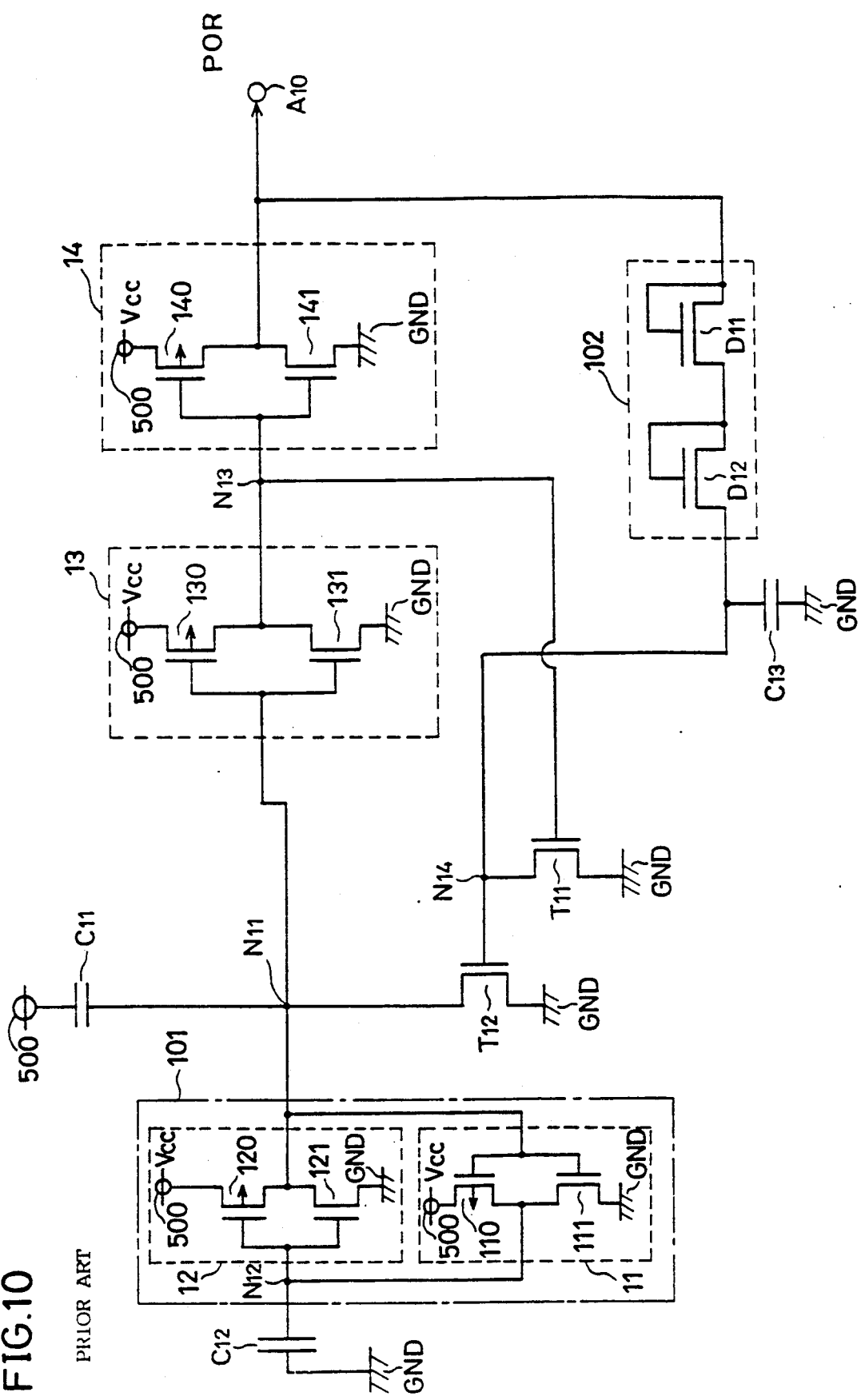
FIG. 10 is a circuit diagram more specifically illustrating a power-on reset pulse generator circuit in FIG. 9.
Figure 11:
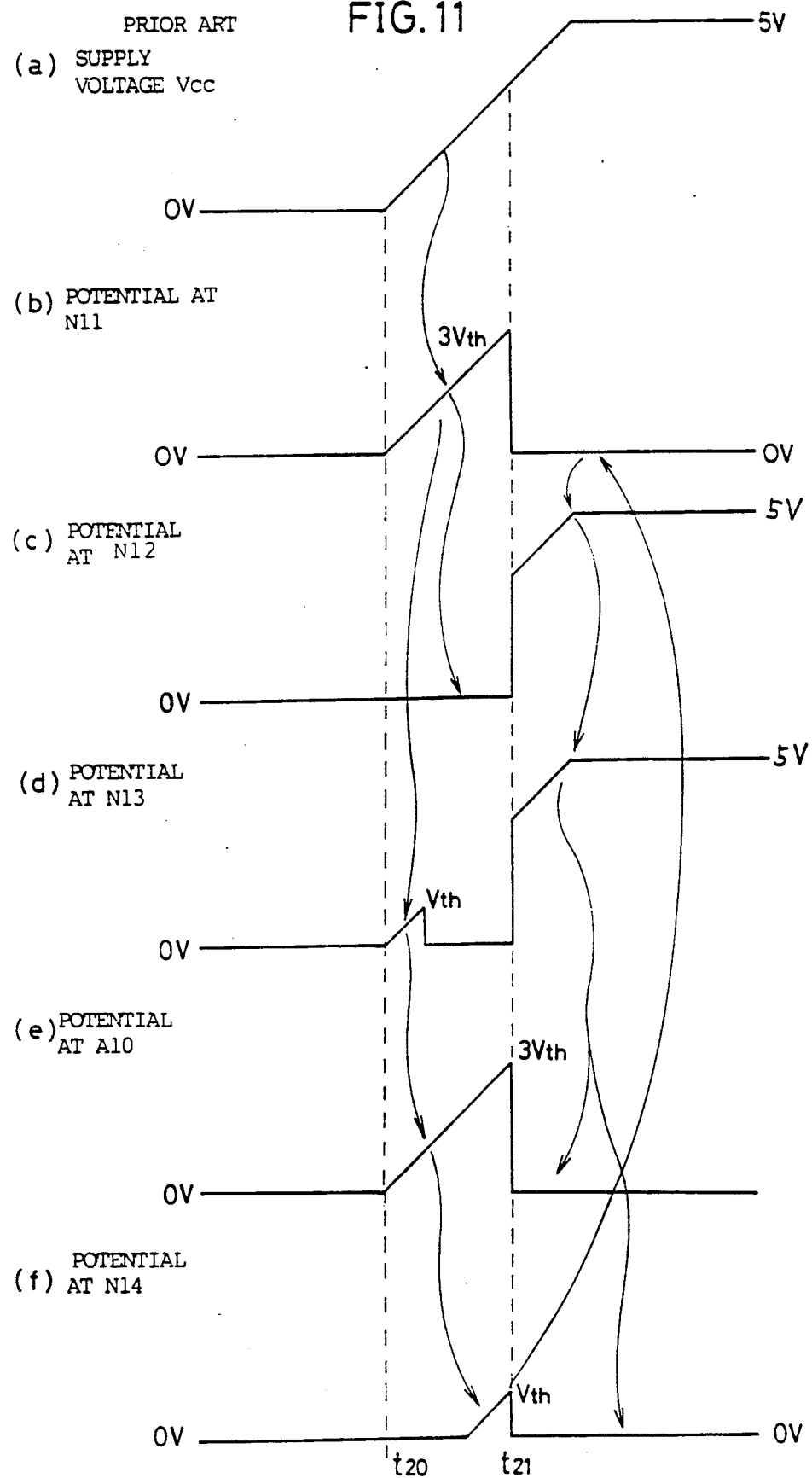
FIG. 11 is a waveform diagram for illustrating operations of a power-on reset pulse generator circuit in FIGS. 9 and 10.
Figure 12:
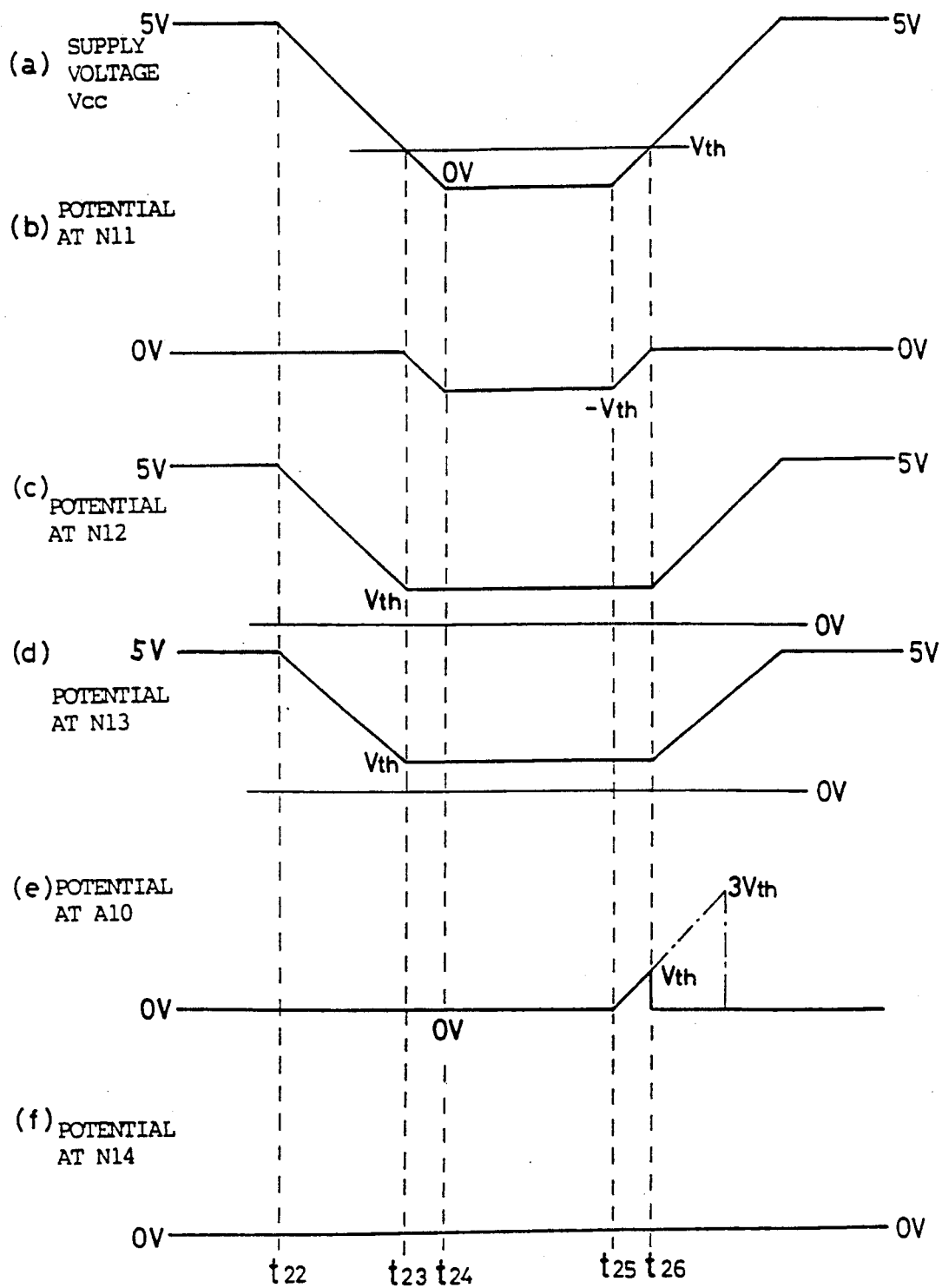
FIG. 12 is a waveform diagram for illustrating problems which a power-on reset pulse generator circuit in the prior art has.

Referring to FIG. 1, which is a circuit diagram illustrating structures of a power-on reset pulse generator circuit according to an embodiment of the invention, the illustrated power-on reset pulse generator circuit differs from the conventional circuit shown in FIG. 10 in that a residual charge compensation circuit 103 is provided at a node N12 between a flip-flop 101 and an inverter 13 for removing residual charges. Structures and operations other than those of the residual charge compensation circuit 103 in this power-on reset pulse generator circuit are the same as those in the power-on reset pulse generator circuit shown in FIG. 10, and thus will not be described hereinafter.

Figure 7:
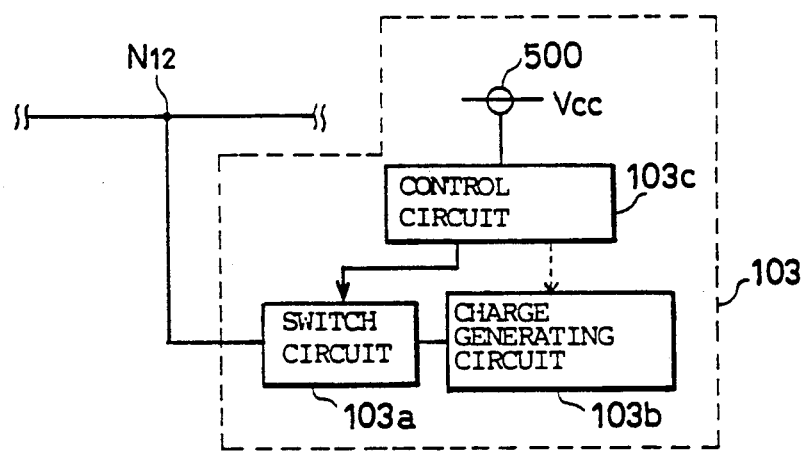
FIG. 7 in a block diagram for illustrating functional structures of a residual charge compensation circuit according to the invention.
Figure 9:
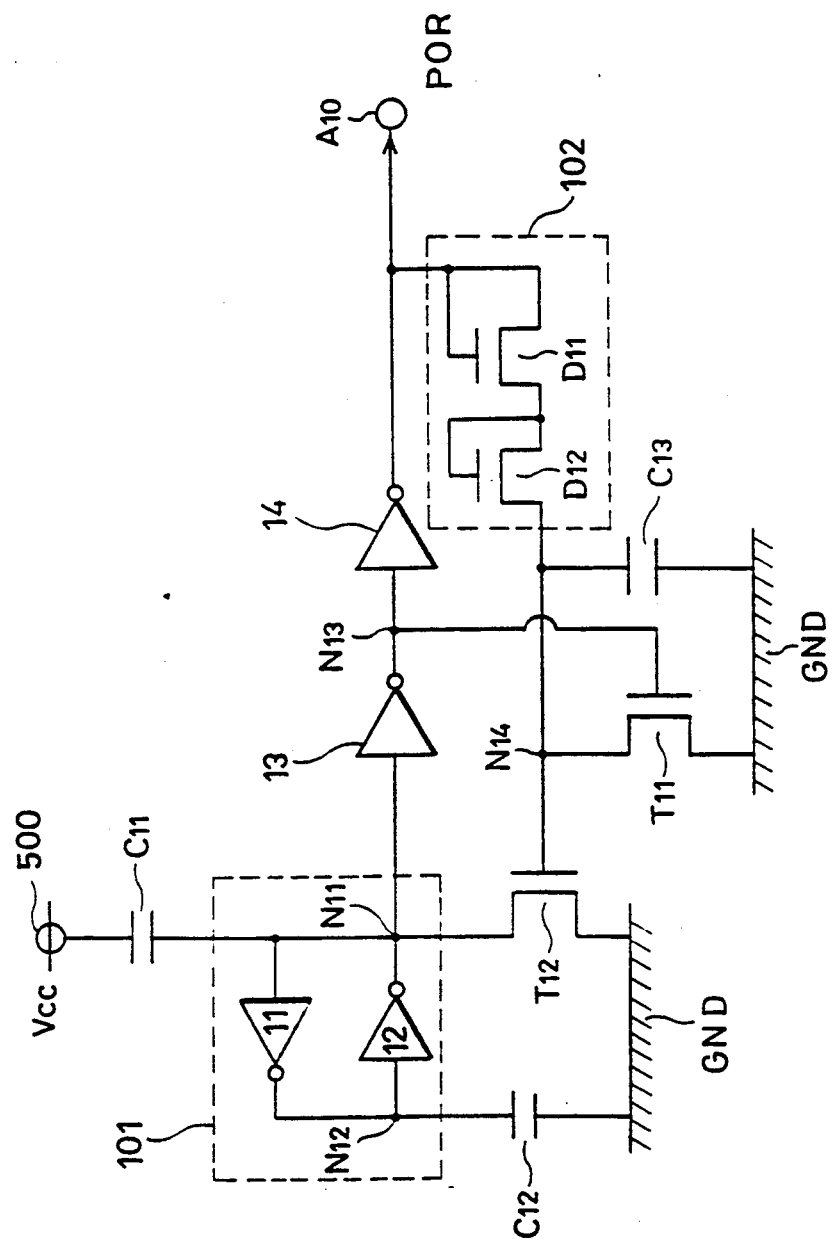
FIG. 9 is a circuit diagram illustrating structures of a power-on reset pulse generator circuit in the prior art.

FIG. 7 is a block diagram showing functionally the structure of the residual charge compensation circuit 103. Referring to FIG. 7, the residual charge compensation circuit 103 includes a switch circuit 103a connected to the node N12 where the charges remain, a charge generating circuit 103b generating charges having opposite polarity to the charges remaining at the node N12 and a control circuit 103c controlling the switching circuit 103a.

The control circuit 103c is connected to the power supply terminal 500 and turns on the switch circuit 103a in response to a fall of the supply voltage Vcc. Consequently, when the power is turned off, the node N12 is electrically connected to the charge generating circuit 103b through the switch circuit 103a, so that the charges remaining at the node N12 offset the charges generated by the charge generating circuit 103b. Therefore, by setting the amount of charges generated by the charge generating circuit 103b larger than the amount of charges remaining at the node N12, the potential at the node N12 is forced to be lower than 0 V when the power is turned off.

More specifically, referring to FIG. 1, the residual charge compensation circuit 103 includes N-channel MOS transistors T13 and D13 connected in series between the node N12 and the ground GND, and a capacitor C14 connect between a supply terminal 500 and a gate of the transistor T13. The transistor D13 has a gate and a drain connected together.

The capacitor C14 and the transistor D13 commonly function as the charge generating circuit 103b and the control circuit 103c of FIG. 7, and the transistor T13 serves as the switch circuit 103a of FIG. 7.

Now, the operation of this residual charge compensation circuit 103 will be described. In the following description, FIGS. 8A to 8D are appropriately referred to. FIGS. 8A to 8D schematically show the flow of charges in the residual charge compensation circuit 103 from the time of power-on until after the turn off after power.

When a power supply is turned on, the potential at the node N15 between the transistor D13 and the capacitor C14 rises in accordance with the rise of the supply voltage Vcc, since positive charges are supplied to the node N15 owing to the coupling of the capacitor C14 (see FIG. 8A). However, since the transistor D13 is in diode-connection, when the potential at the node N15 rises to or above the threshold voltage Vth of the MOS transistor, the transistor D13 becomes conductive so that the positive charges flow from the node N15 to the ground GND through the transistor D13 to lower the drain potential of the transistor D13 (see FIG. 8B). The operation of the transistor D13 clamps the potential in the node N15 at said threshold voltage Vth. Therefore, the transistor T13 is in the OFF state. For this reason, the residual charge compensation circuit 103 exerts no influence on the node N12. Therefore, the power-on reset pulse generator circuit performs the operations completely same as those shown in FIG. 10 after the power-on.

Now, the operations of the residual charge compensation circuit 103 at the power-off will be described.

Figure 2:
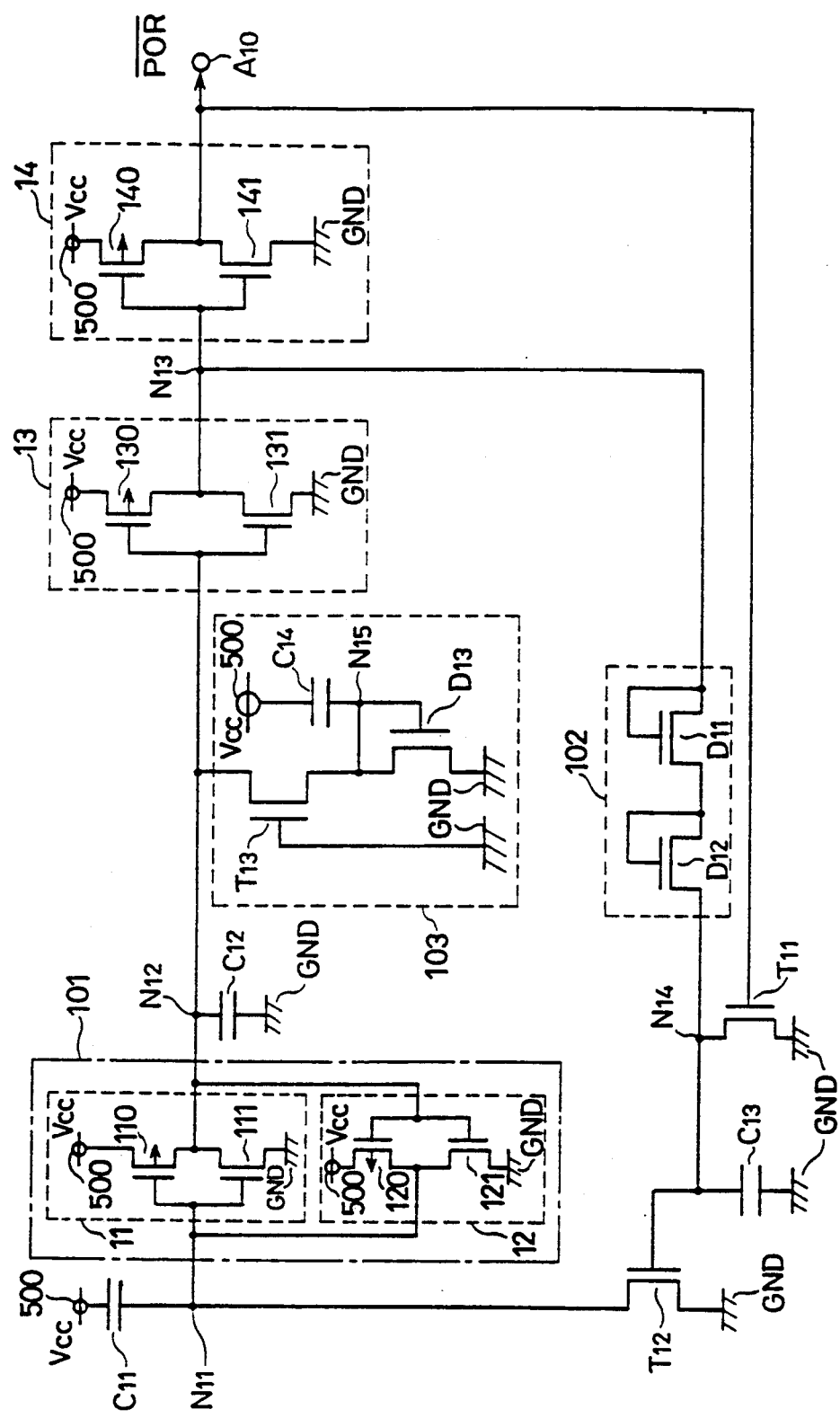
FIG. 2 is a circuit diagram more specifically illustrating a power-on reset pulse generator circuit in FIG. 1.
Figure 3:
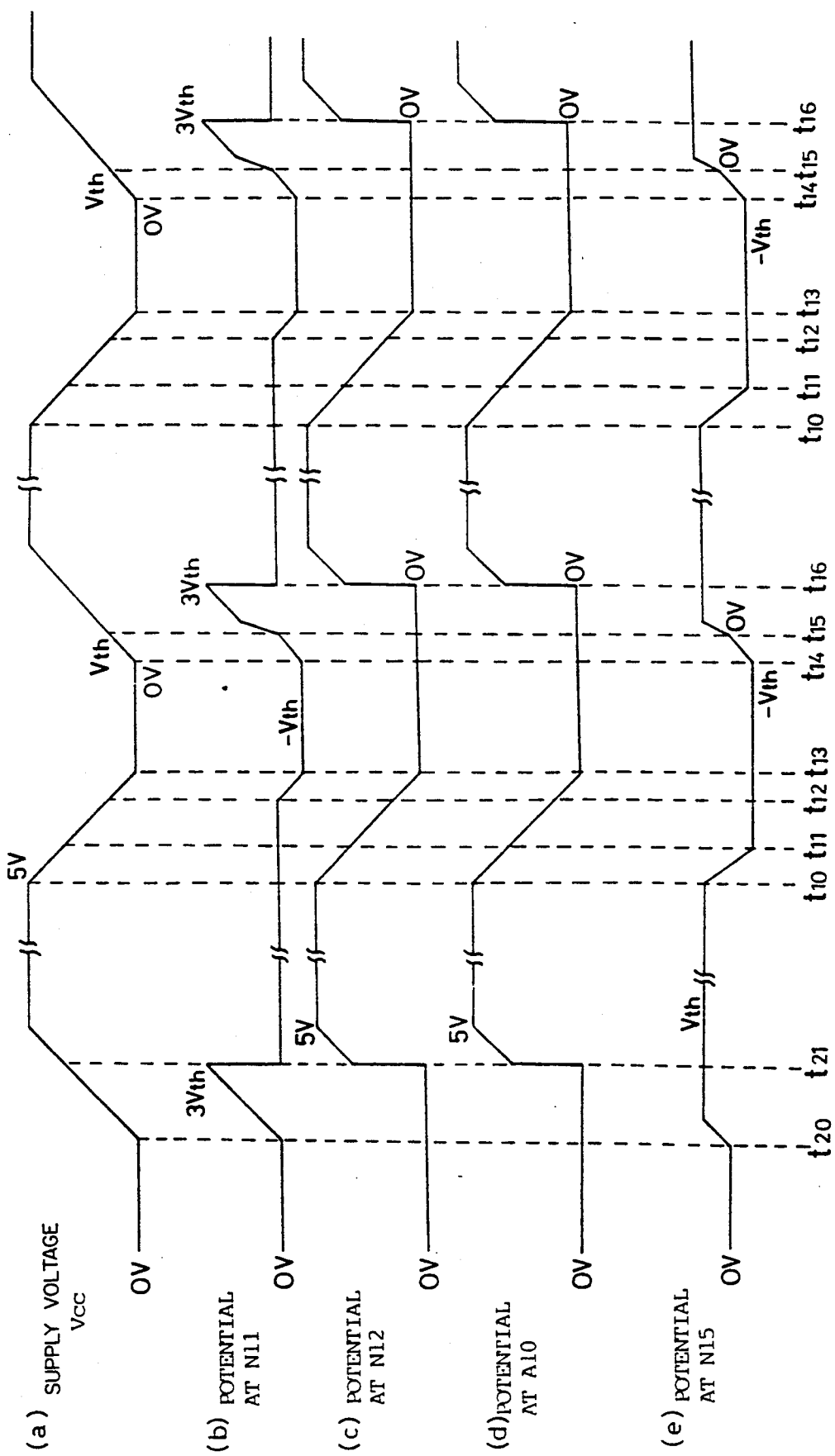
FIG. 3 is a waveform diagram for illustrating operations of a power-on reset pulse generator circuit in FIGS. 1 and 2.

As already discussed in description of the prior art, before the power-off, i.e., in such a condition that the potential in the output terminal A10 is fixed at the H level, the node N12 has the potential at the H level (=5 V) owing to the supply voltage Vcc. In this condition, the potential at the node N15 is clamped at the threshold voltage Vth, as described before. Following discussion of the operations will be made with reference to FIGS. 2 and 3. FIG. 2 is a circuit diagram more specifically illustrating the structures of the power-on reset pulse generator circuit. FIG. 3 is a waveform diagram illustrating the operations of the power-on reset pulse generator circuit in FIG. 1 when the power supply is turned on before the charges are sufficiently discharged from the nodes N11 and N12 after the last power-off.

FIG. 3 shows an example in which power is first turned on at t20 when potential at every node in the power-on reset pulse generating is circuit 0 V, and turning off and turning on of the power are repeated with a short interval not allowing sufficient discharge of the node N12.

Referring to FIGS. 2 and 3, when the power supply is turned off at the time t10 and thus the supply voltage Vcc ((a) in FIG. 3) starts to lower, the potentials at the node N12 and the terminal A10, which have been at the H level, start to lower along with the supply voltage Vcc owing to the transistors 110 and 140 in the ON state (see (c) and (d) in FIG. 3).

Meanwhile, the node N15 is clamped at Vth so that the transistors T13 and D13 are both in the OFF state. Therefore, in the residual charge compensation circuit 103, the capacitor C14 starts to supply the negative charges to the node N15 in response to the power-off (see FIG. 8C). Thereby, the potential ((e) in FIG. 3) at the node N15 reaches −Vth at the time t11 after the elapse of time, which is determined by a ratio of the capacitance of the capacitor C14 and a stray capacitance of the node N15, from the time t10. When the supply voltage Vcc further lowers after this time t11, the potential at the node N15 tends to lower further below −Vth, so that the source potential of the transistor T13 tends to drop to a high potential which is lower than the gate potential (0 V) of the transistor T13 by a voltage equal to or larger than the threshold voltage Vth. Therefore, the transistor T13 is turned on and tends to lower the potential at the node N12 below the supply voltage Vcc at that time. The potential at the node 15, however, depends on the charging operation of the capacitor C14 and thus is unstable. In contrast to this, since the node N12 is connected to the supply terminal 500 through the transistor 110 in the ON state, the potential at the node N12 is relatively stable as compared with the potential at the node N15. Therefore, the potential at node N12 is held at a voltage equal to the supply voltage Vcc by the output of the inverter 11. Meanwhile, the potential at the node N15 is clamped at −Vth even after the time t11 by the positive charges supplied from the node N12 through the transistor T13 to the node N15.

When the supply voltage Vcc lowers to the threshold voltage Vth of the MOS transistor at the time t12, all of the transistors except for the transistor T13 in this power-on reset pulse generator circuit are turned off as in the prior art. Therefore, in the flip-flop 101 and the inverter 13, the discharge path for the charge from the node N12 is electrically cut, so that the positive charges tend to remain in the node N12. However, in the illustrated embodiment, the transistor T13 in the ON state is connected to the node N12. While the supply voltage Vcc further lowers from the threshold voltage Vth to 0 V, since the transistor 110 does not operate, the potential at the node N12 is not fixed any longer. Therefore, in this period, the potential at the node N15 tends to be further lowered below −Vth by the negative charges supplied to the node N15 from the capacitor C14. Therefore, the transistor T13 is maintained at the ON state for this period. Consequently, the negative charges are supplied from the node N15 to the node N12 (see FIG. 8D). As a result, the positive charges remaining in the node N12 and the negative charges existing in the node N15 offset each other in the period from the time t12 at which the supply voltage Vcc reached the threshold voltage Vth to the time t13 at which it completely lowers to 0 V. Thus, the residual charges at the node N12 are removed, so that the potential at the node N12 returns to 0 V.

The potential at the node N12 at the time t13 when the supply voltage Vcc lowers to 0 V can be freely set, for instance, by adjusting a capacitance ratio between the capacitors C12 and C14.

Theoretically, if the capacitor C14 has a capacitance the same as that of the capacitor C12, the negative charges supplied from the capacitor C14 to the node N15 for the period between the times t12 and t13 are well balanced with the positive charges remaining in the node N12 to offset the same. Therefore, the capacitor thus set in the capacitor C14 must allow the potential at the node N12 to reach 0 V at the time t13 when the supply voltage Vcc lowers to 0 V. (See (c) in FIG. 3.) If it is desired or required to set the potential at the node N12 at the next power-on to the potential lower than 0 V, this can be accomplished by setting the capacitance of the capacitor C14 larger than that of the capacitor C12. Conversely, if the capacitance of the capacitor C14 is excessively smaller than that of the capacitor C12, the residual charges in the node N12 cannot be fully removed, and thus the node N12 cannot have the sufficiently low potential at the time t13.

However, actually, there is some leak of charges from the electric path connecting the capacitor C12 and the capacitor C14, and therefore the amount of charges supplied from the node N15 to the node N12 through the transistor T13 when the transistor T13 is conductive is smaller to some extent than the total amount of the negative charges supplied by the discharge of the capacitor C14 to the node N15. Therefore, if the capacitance of the capacitor C12 and the capacitance of the capacitor C14 are completely the same, the positive charges remaining at the node N12 can not be fully compensated by the negative charges supplied from the node N15, and therefore the potential at the node N12 at the time t13 is little higher than 0 V. Namely, the potential at the node N12 at t14 when the power is turned on again becomes positive. In addition, as described above, in order to surely and properly set the flip flop 101 when the power is turned on again, the potential at the node N12 when the power is turned on again should be 0 V or lower.

In view of the foregoing, the capacitance of the capacitor C14 should be set larger than the capacitance of the capacitor C12, to some extent.

If the potential at the node N12 reaches 0 V or less at the time t13, the power supply can be turned on immediately after the time t13 or at very rapid timing thereafter without the malfunction of this power-on reset pulse generator circuit. Then, the discussion is made with reference to the circuit operations in which the power supply is turned on again after the time t13. In the description, it is assumed that the potential at the node N12 when the power is turned on again is 0 V.

If the node N12 had the potential of 0 V at the time t13 when the supply voltage Vcc once lowers to 0 V, the nodes N12 and N15 have the potentials of 0 V and −Vth at the time t14 of the next power-on, respectively. Meanwhile, at the time t14, the node N11 has the potential of −Vth, and the potentials at the nodes N13 and N14 and the output terminal A10 are 0 V. Accordingly, after this power-on, the node N11 will have the potential of 0 V at the time t15 when the supply voltage Vcc reaches the threshold voltage Vth allowing the MOS transistors to start the operation. Meanwhile, after the power-on, the potential at the node N15 rises along with the rising supply voltage Vcc and reaches 0 V at the time t15. Therefore, at the time t15, the potentials at all the nodes included in this power-on reset pulse generator circuit are set at 0 V. Therefore, after the time t15, this power-on reset pulse generator circuit operates in response to the rise of the supply voltage Vcc to send the pulses at the L level to the output terminal A10 for the predetermined period.

More specifically, after the time t15, the potential at the node N11 rises in accordance with the rise of the supply voltage Vcc owing to the coupling of the capacitor C11. Meanwhile, the potential at the node N12 is held at 0 V which is the same as that at the power-on time t14 by the capacitor C12. Therefore, the flip-flop 101 is set such that the potential at the node N11 and the potential at the node N12 have the H level and the L level, respectively. Consequently, the turned-on transistor 130 in the inverter 13 increases the potential at the node N13 in response to the change of the supply voltage Vcc. When the supply voltage Vcc reaches the sum 3 Vth of the threshold voltage 2Vth of the MOS diode array 102 and the threshold voltage Vth of the transistor T12 at the time t16, the transistor T12 becomes conductive and lowers the potential at the node N11 to 0 V. (See (b) in FIG. 3.) In response to this, the transistors 110 and 121 in the inverters 11 and 12 become conductive. Therefore, the potential at the node N12 rises to the supply voltage Vcc at the time t16, and will follow the change of the supply voltage Vcc to become 5 V thereafter. The potential at the node N12 is inverted by the inverter 13 to transmit to the node N13 so that the potential at the node N13 responds to the rise of the potential at the node N12 by lowering to 0 V. Therefore, the potential at the output of the inverter 14, i.e., the output terminal A10, as indicated by (d) in FIG. 3, rises to the current supply voltage Vcc at the time t16 when the potential at the node N11 drops, and will follow the change of the supply voltage Vcc to rise to 5 V thereafter.

As discussed above, in the residual charge compensation circuit 103, the potential at the node N15 rises along with the rising supply voltage Vcc after the power-on time t14, to be clamped at the threshold voltage Vth for holding the transistor T13 in the OFF state. (See (e) in FIG. 3.)

Figure 13:
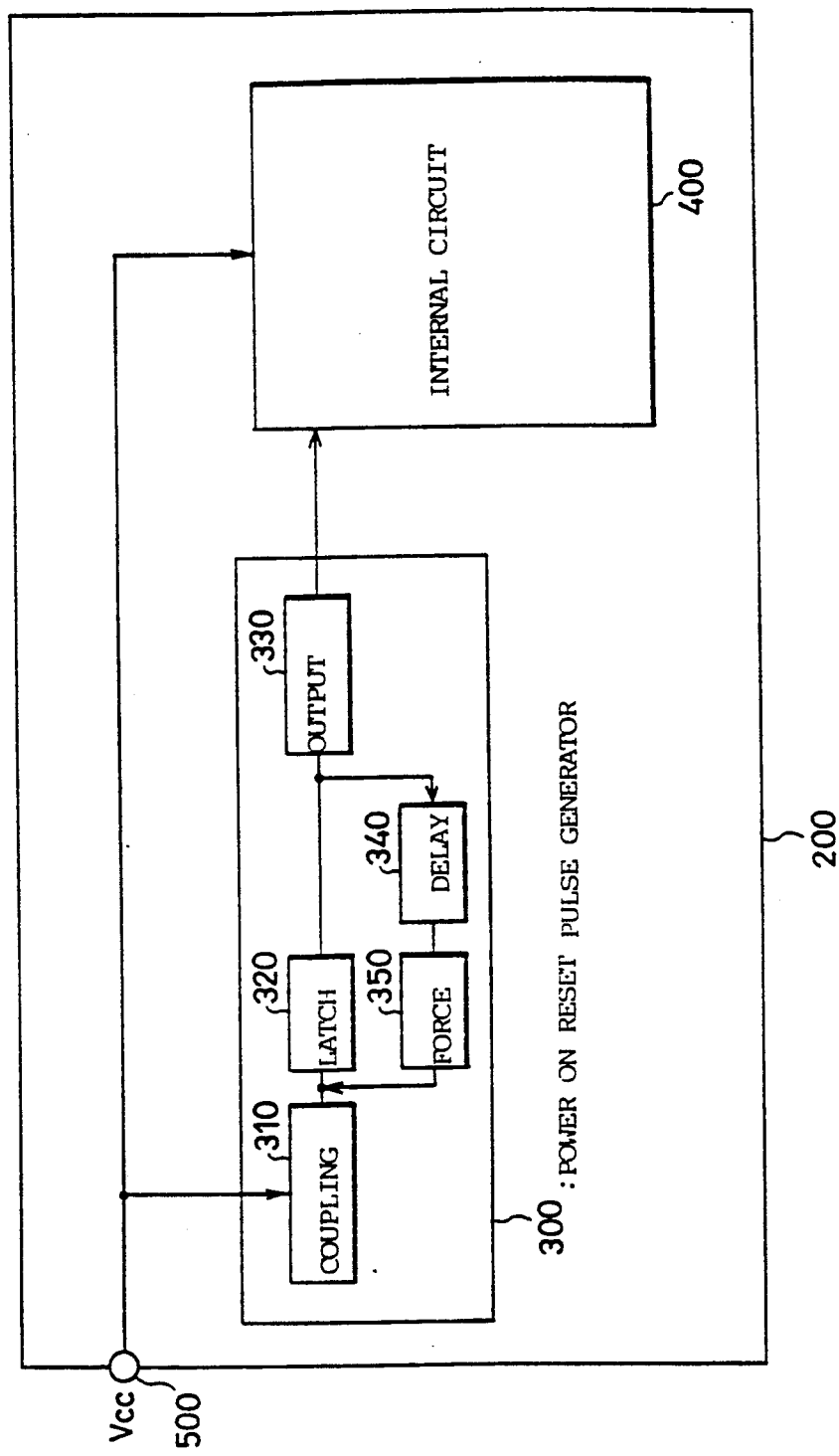
FIG. 13 is a block diagram of a semiconductor integrated circuit device including a power-on reset pulse generator circuit.
Figure 14:
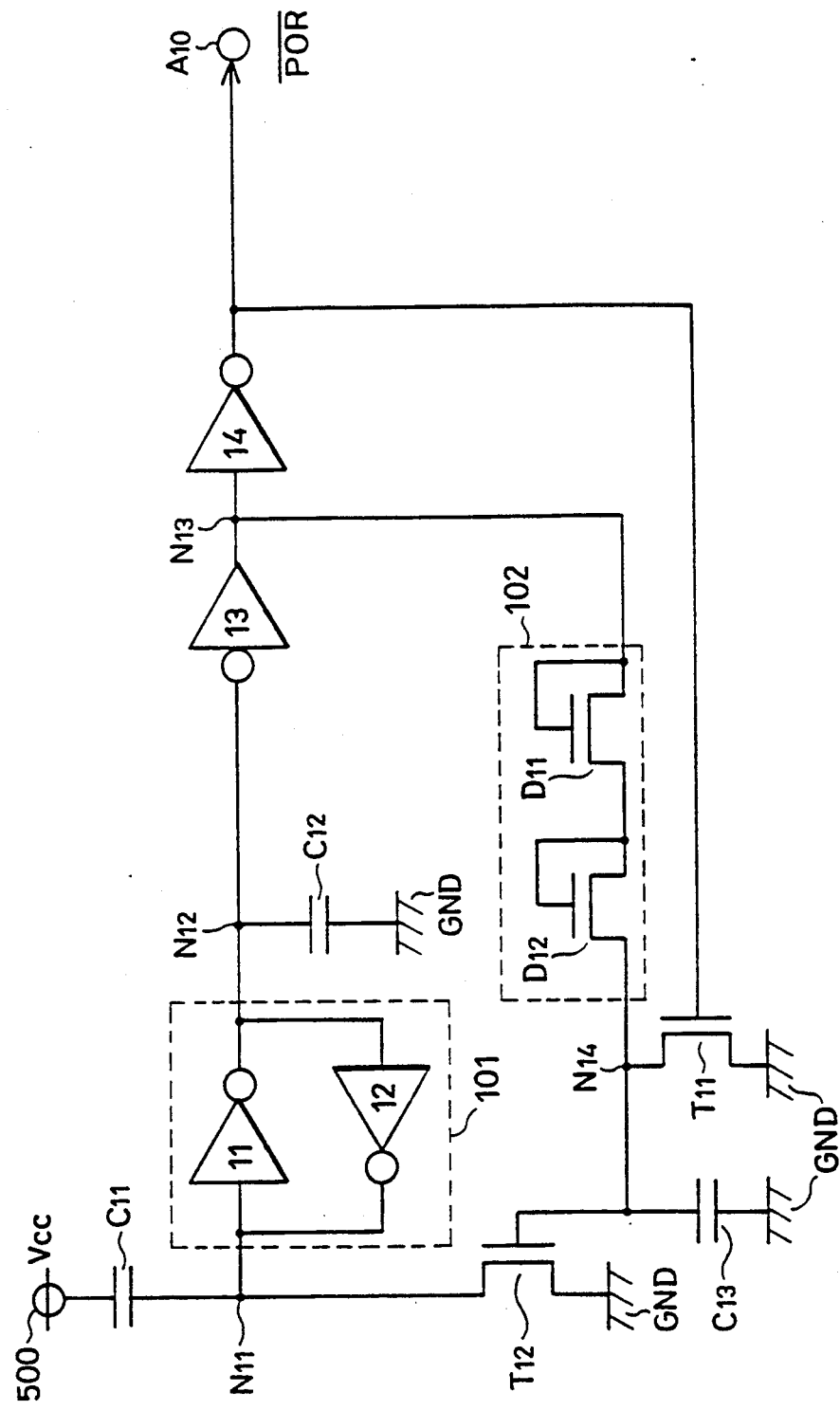
FIG. 14 is a circuit diagram illustrating structures of a power-on reset pulse generator circuit in the prior art.

As described above, according to the power-on reset pulse generator circuit of the above described embodiment, the potential at the node N12 can surely have the L level for the predetermined period after the supply voltage Vcc reaches the threshold voltage Vth, even if the period from the power-off time t10 to the next power-on time t14 is short. Thus, the power-on reset pulse $\overline{POR}$ which can sufficiently reset the internal circuit 400 in FIG. 13 can be introduced to the output terminal A10.

Figure 4:
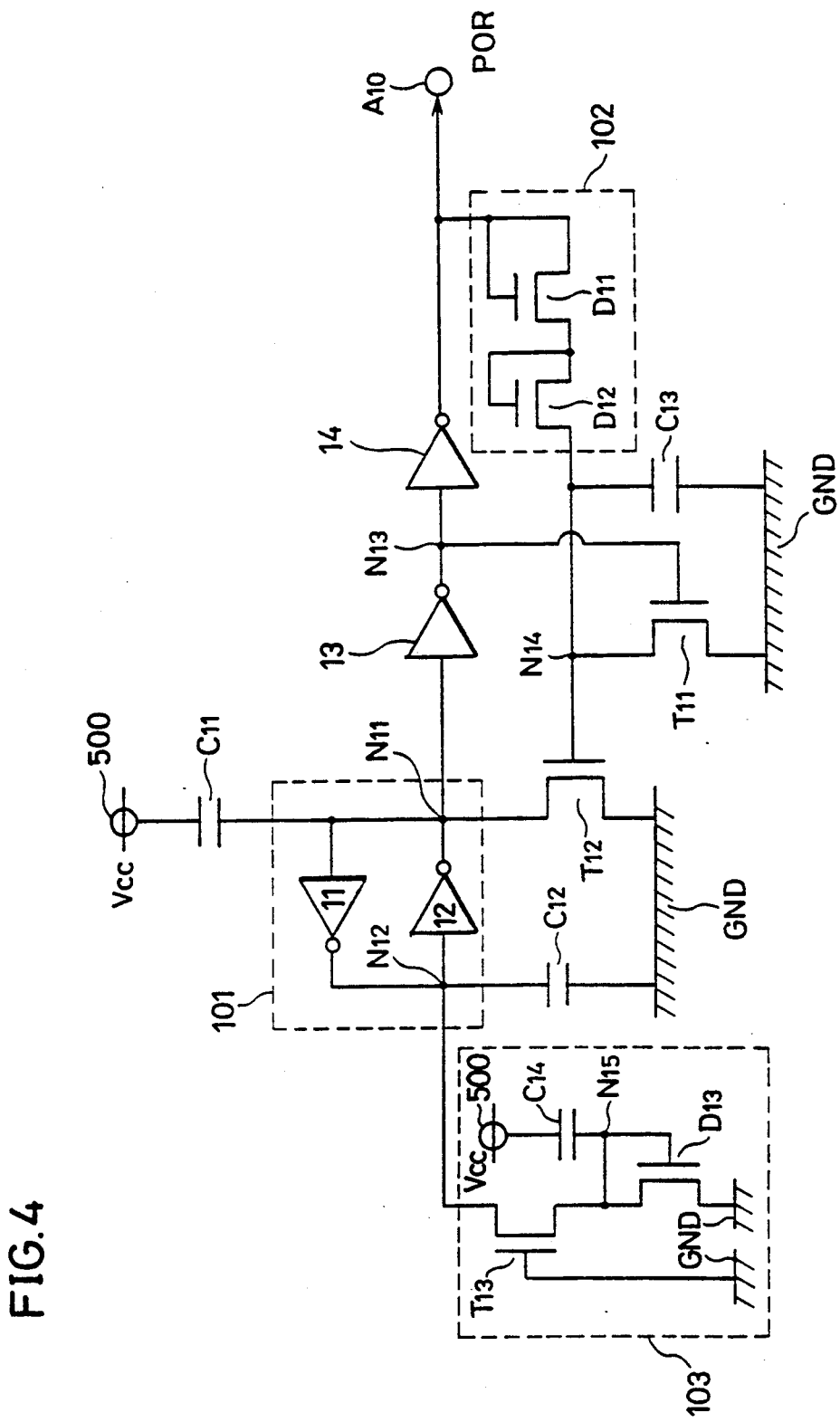
FIG. 4 is a circuit diagram illustrating structures of a power-on reset pulse generator circuit according to another embodiment of the invention.
Figure 15:
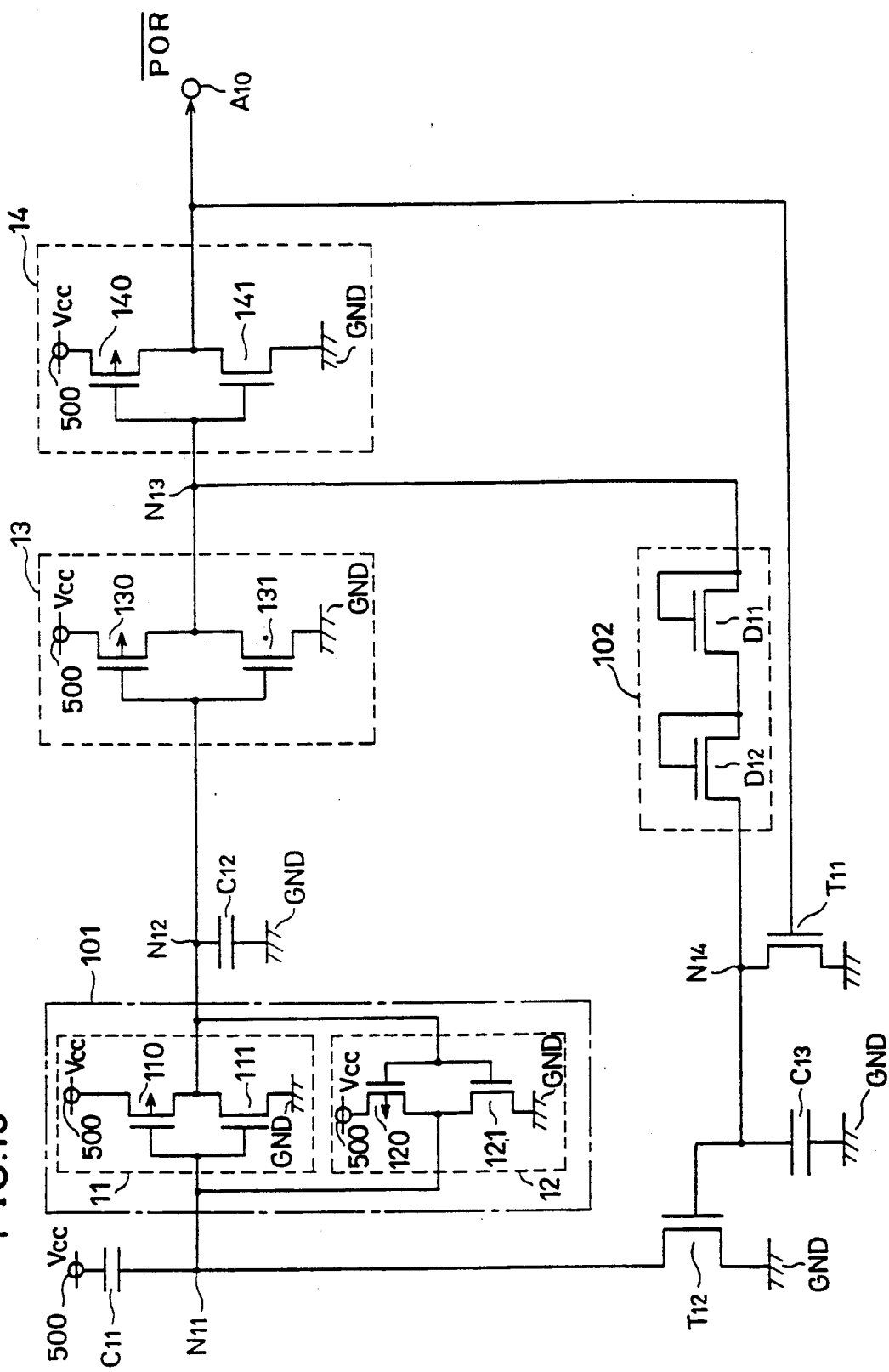
FIG. 15 is a circuit diagram more specifically illustrating a power-on reset pulse generator circuit in FIG. 14.
Figure 17:
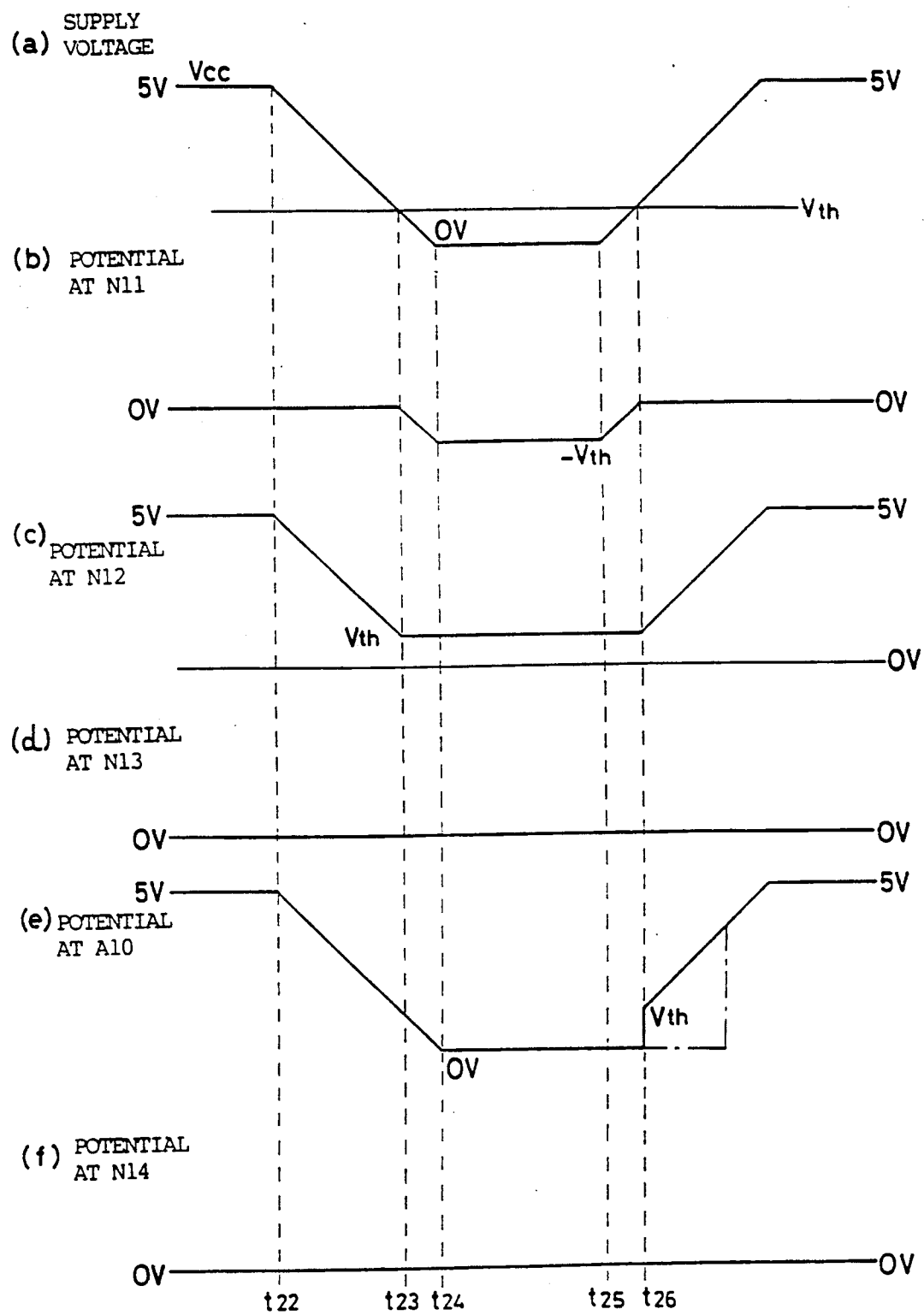
FIG. 17 is a waveform diagram for illustrating problems which a power-on reset pulse generator circuit in the prior art has.
Figure 18B:
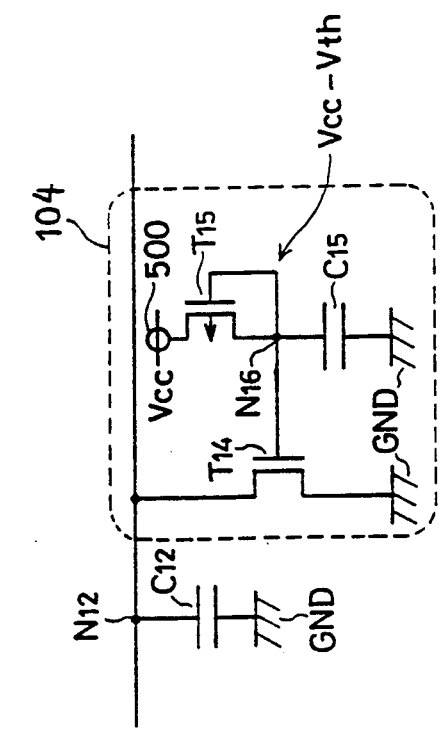
FIGS. 18(a) and 18(b) are circuit diagrams for illustrating structures of a residual charge removing circuit in the prior art.
Figure 18A:
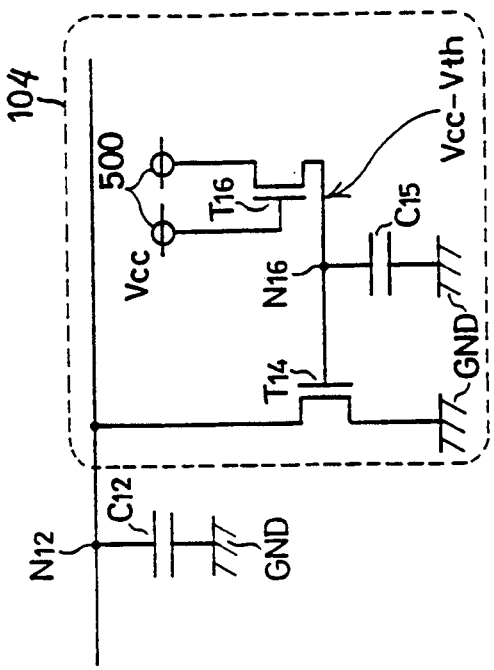
Figure 19:
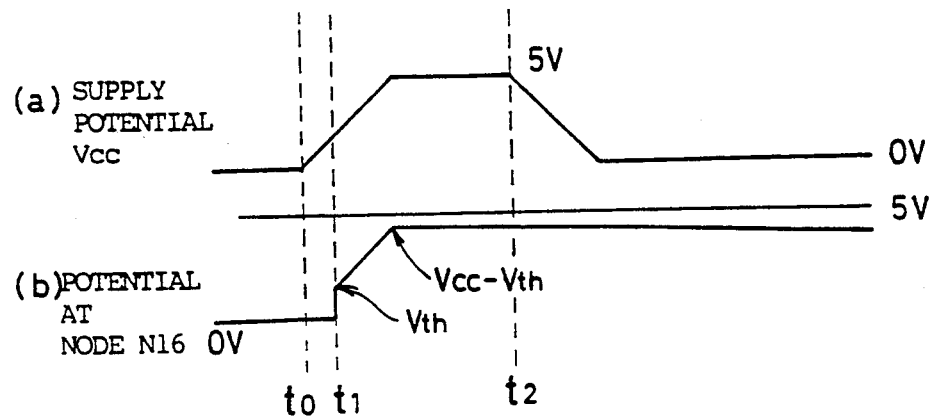
FIG. 19 in a waveform diagram for explaining operations of a residual charge removing circuit in FIG. 18.

FIG. 4 is a schematic diagram showing the above described residual charge compensation circuit 103 applied to the power-on reset pulse generating circuit having the structure of FIG. 15, showing a structure of a power-on reset pulse generating circuit in accordance with another embodiment of the present invention. Referring to FIG. 4, in the power-on reset pulse generating circuit also, the residual charge compensation circuit 103 is connected to the node N12 which is an input end of the inverter 12.

Since the operation of the residual charge compensation circuit 103 when the power is turned on and off is the same as the above described embodiment, the description thereof is not repeated.

Now, the operations of the power-on reset pulse generator circuit according to this embodiment at the power-off will be described.

Figure 5:
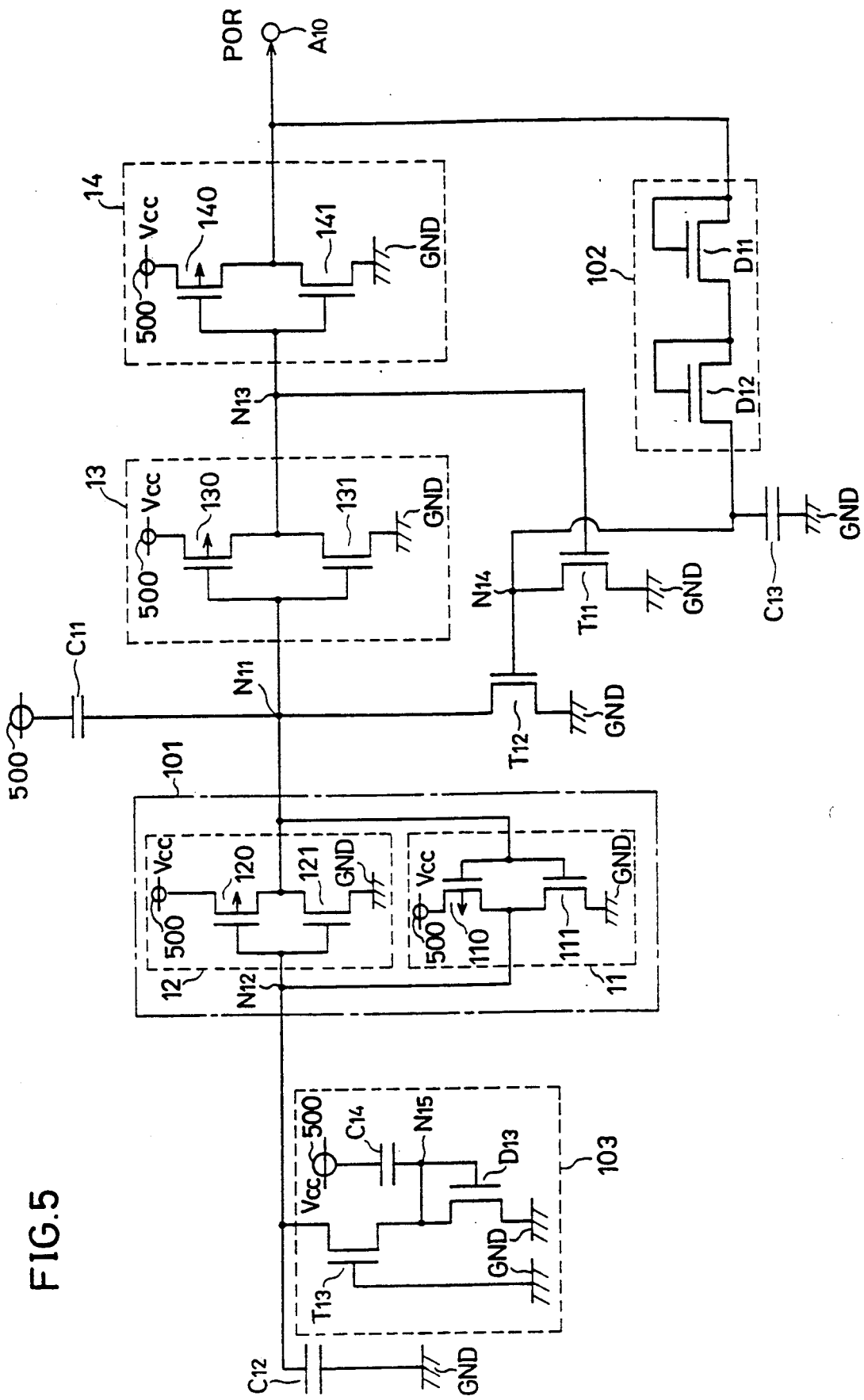
FIG. 5 is a circuit diagram more specifically illustrating a power-on reset pulse generator circuit in FIG. 4.
Figure 6:
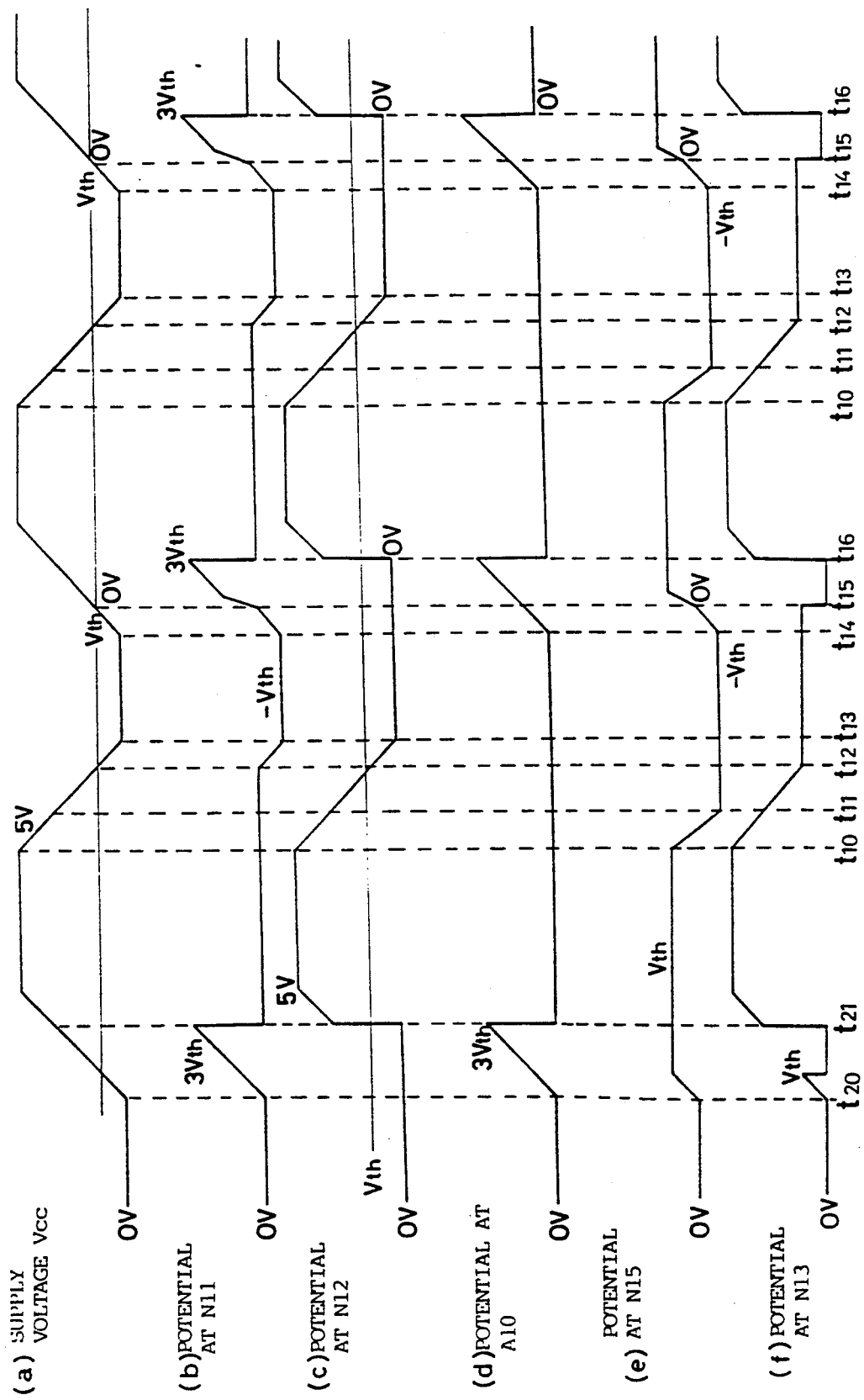
FIG. 6 is a waveform diagram for illustrating operations of a power-on reset pulse generator circuit in FIGS. 4 and 5.

As already discussed in description of the prior art, before the power-off, i.e., in such a condition that the potential in the output terminal A10 is fixed at the L level, the nodes N12 and N13 have the potentials at the H level (=5 V) owing to the supply voltage Vcc. In this condition, the potential at the node N15 is clamped at the threshold voltage Vth, as described before. Following discussion of the operations will be made with reference to FIGS. 5 and 6. FIG. 5 is a circuit diagram more specifically illustrating the structures of the power-on reset pulse generator circuit. FIG. 6 is a waveform diagram illustrating the operations of the power-on reset pulse generator circuit in FIG. 4 when the power supply is turned on before the charges are sufficiently discharged from the nodes N12 and N13 after the last power-off. FIG. 6 shows a case in which power is turned on first at t20 when the potential at every node in the power-on reset pulse generating circuit is 0 V, and then turning on and off are repeated.

Referring to FIGS. 5 and 6, when the power supply is turned off at the time t10 and thus the supply voltage Vcc ((a) in FIG. 6) starts to lower, the potential at the node N12, which has been at the H level, start to lower along with the supply voltage Vcc owing t the transistor 110 in the ON state (see (c) and (d) in FIG. 6).

Meanwhile, the node N15 is clamped at Vth so that the transistors T13 and D13 are both in the OFF state. Therefore, in the residual charge compensation circuit 103, the capacitor C14 starts to supply the negative charges to the node N15 in response to the power-off (see FIG. 8C). Thereby, the potential ((e) in FIG. 6) at the node N15 reaches −Vth at the time t11 after the elapse of time, which is determined by a ratio of the capacitance of the capacitor C14 and a stray capacitance of the node N15, from the time t10. When the supply voltage Vcc further lowers after this time t11, the potential at the node N15 tends to lower further below −Vth, so that the source potential of the transistor T13 tends to drop to a potential which is lower than the gate potential (0 V) of the transistor T13 by a voltage equal to or larger than the threshold voltage Vth. Therefore, the transistor T13 is turned on and tends to lower the potential at the node N12 below the supply voltage Vcc at that time. The potential at the node 15 is however depends on the charging operation of the capacitor C14 and thus is unstable. In contact to this, since the node N12 is connected to the supply terminal 500 through the transistor 110 in the ON state, the potential at the node N12 is relatively stable as compared with the potential at the node N15. Therefore, the potential at node N12 is held at a voltage equal to the supply voltage Vcc by the output of the inverter 11. Meanwhile, the potential at the node N15 is clamped at −Vth even after the time t11 by the positive charges supplied from the node N12 through the transistor T13 to the node N15.

When the supply voltage Vcc lowers to the threshold voltage Vth of the MOS transistor at the time t12, all of the transistors except for the transistor T13 in this power-on reset pulse generator circuit are turned off as in the prior art. Therefore, in the flip-flop 101 and the inverter 11, the discharge path for the charge from the node N12 is electrically cut, so that the positive charges tend to remain in the node N12. However, in the illustrated embodiment, the transistor T13 in the ON state is connected to the node N12. While the supply voltage Vcc further lowers from the threshold voltage Vth to 0 V, since the transistor 110 does not operate, the potential at the node N12 is not fixed any longer. Therefore, in this period, the potential at the node N15 tends to be further lowered below −Vth by the negative charges supplied to the node N15 from the capacitor C14. Therefore, the transistor T13 is maintained at the ON state for this period. Consequently, the negative charges are supplied from the node N15 to the node N12 (see FIG. 8D). As a result, the positive charges remaining in the node N12 and the negative charges existing in the node N15 offset each other in the period from the time t12 at which the supply voltage Vcc reached the threshold voltage Vth to the time t13 at which it completely lowers to 0 V. Therefore, if the capacitance of the capacitor C14 is larger than that of the capacitor C12, the residual charges at the node N12 are removed, so that the potential at the node N12 falls to 0 V or less at a time t13 when the supply voltage Vcc lowers t 0 V (see (c) in FIG. 6).

If the potential at the node N12 reaches 0 V or less at the time t13, the power supply can be turned on immediately after the time t13 or at very rapid timing thereafter without the malfunction of this power-on reset pulse generator circuit, like the already described embodiment. Then, the discussion is made with reference to the circuit operations in which the power supply is turned on again after the time 13. In the following description, it is assumed that the potential at the node N12 at t13 is 0 V.

If the node N12 had the potential of 0 V at the time t13 when the supply voltage Vcc once lowers to 0 V, the nodes N12 and N15 have the potentials of 0 V and −Vth at the time t14 of the next power-on, respectively. Meanwhile, at the time t14, the nodes N11 and N13 has the potentials of −Vth and Vth, respectively, and the potentials at the node N14 and the output terminal A10 are 0 V and 5 V, respectively. Accordingly, after this power-on, the node N11 will have the potential of 0 V at the time t15 when the supply voltage Vcc reaches the threshold voltage Vth allowing the MOS transistors to start the operation. Meanwhile, after the power-on, the potential at the node N15 rises along with the rising supply voltage Vcc and reaches 0 V at the time t15. Therefore, at the time t15, the potentials at all the nodes included in this power-on reset pulse generator circuit are set at 0 V. Therefore, after the time t15, this power-on reset pulse generator circuit operates in response to the rise of the supply voltage Vcc to send the pulses at the H level to the output terminal A10 for the predetermined period.

More specifically, after the time t15, the potential at the node N11 rises in accordance with the rise of the supply voltage Vcc owing to the coupling of the capacitor C11. Meanwhile, the potential at the node N12 is held at 0 V which is the same as that at the power-on time t14 by the capacitor C12. Therefore, the flip-flop 101 is set such that the potential at the node N11 and the potential at the node N12 have the H level and the L level, respectively. Consequently, the turned-on transistor 120 in the inverter 12 increases the potential at the node N11 in response to the change of the supply voltage Vcc. Accordingly, when the supply voltage Vcc reaches the threshold voltage Vth at the time t15, the transistor 131 in the inverter 13 becomes conductive. As a result, the node N13 has the potential of 0 V until the supply voltage Vcc reaches the sum 3 vth of the threshold voltage 2 Vth of the MOS diode array 102 and the threshold voltage Vth of the transistor T12 at the time t16 (see (f) in FIG. 6). Accordingly, the transistor 140 in the inverter 14 is conductive so that the potential at the output terminal A10 rises in response to the change of the supply voltage Vcc, for a period from the time t14 to the time t16. (See (d) in FIG. 6.)

The transistor T12 becomes conductive to lower the potential at the node N11 to 0 V, at the time t16. (See (b) in FIG. 6.) In response to this, the transistors 110 and 121 in the inverters 11 and 12 become conductive. Therefore, the potential at the node N12 rises to the supply voltage Vcc at the time t16, and will follow the change of the supply voltage Vcc to become 5 V thereafter. The potential at the node N11 is inverted by the inverter 13 to transmit to the node N13 so that the potential at the node N13 responds to the rise of the potential at the node N12 by rising to 5 V in accordance with the supply voltage Vcc. Therefore, the potential at the output terminal A10, as indicated by (d) in FIG. 6, rises in response to the current supply voltage Vcc until the time t16 when the potential at the node N11 drops, and will drop to 0 V thereafter.

As discussed above, in the residual charge compensation circuit 103, the potential at the node N15 rises along with the rising supply voltage Vcc after the power-on time t14, to be clamped at the threshold voltage Vth for holding the transistor T13 in the OFF state. (See (e) in FIG. 6.)

As described above, also according to the power-on reset pulse generator circuit of the above describe embodiment, the potential at the node N12 can surely have the L level for the predetermined period after the supply voltage Vcc reaches the threshold Vth, even if the period from the power-off time t10 to the next power-on time t14 is short. As a result, the power-on reset pulse POR which can sufficiently reset the internal circuit 400 in FIG. 8 can be introduced to the output terminal A10.

In this embodiment also, it is possible to set the potential at the node N12 when the power is turned on again to be lower than 0 V, by setting the capacitance of the capacitor C14 to be sufficiently larger than that of the capacitor C12.

In the examples shown in FIGS. 3 and 6, the potential at the node N12 when the power is turned on is 0 V. However, in any of the above described embodiments, the operation when the potential at the node N12 at the time of turning on of the power again is lower than 0 V is selfevident from the above description, so that the description is not repeated.

In this manner, by using the residual charge compensation circuit 103 of the present embodiment, the potential at the node N12 where charges remain when the power is turned off can be set at an arbitrary potential not higher than 0 V. Therefore, if the residual charge compensation circuit 103 is applied to, for example, a power-on reset pulse generating circuit, the flip flop 101 can be surely set to a direction allowing an output potential of the inverter 12 to attain high level, when the power is turned on again. Therefore, compared with the conventional method of removing the residual charges at the node N12, an appropriate power-on reset pulse can be surely provided.

Further, according to the residual charge compensation circuit 103, the through current flows from the supply terminal 500 to the ground GND only for the short period from the power-on time t14 to the time t15 at which the supply voltage Vcc reaches the threshold voltage Vth of the MOS transistor. Therefore, as compared with the conventional method in which the residual charges are removed by grounding the node N12 through the resistor, the increase of the power consumption can be suppressed by using the residual charge compensation circuit 103 of the embodiment for removing the residual charges at the node N12. Further, the residual charge compensation circuit 103 includes two MOS transistors and the capacitor C12, and the sizes of the transistors D13 and T13 are preferably to be small for suppressing the increase of the power consumption due to the through current. Therefore, it is not necessary to increase the area on the semiconductor substrate occupied by the circuit elements used for removing the residual charges at the node N12, which is required in the prior art so as to decrease the through current. Accordingly, the residual charge compensation circuit of the embodiment can surely force the potential at the node which may contain the residual charges at the power-off to the desired potential, without increasing the power consumption and the occupied area. Consequently, such power-on reset pulse generator circuit can be obtained that, even if the period from the power-off to the next power-on is short, the power-on reset pulse $\overline{POR}$ or POR which can sufficiently initialize the internal circuit 400 can be output, and that the high integration and the low power consumption of the semiconductor integrated circuit device can be allowed.

Although the residual charge compensation circuit according to the invention has been discussed with reference to the case where it is applied to the power-on reset pulse generator circuit, the residual charge removing compensation according to the invention may be connected to any node to which the residual charges generated at the power-off may be stored so as to remove the residual charges therein. In this case, factors such as sizes of the transistors D13 and T13 and capacitance of the capacitor C14 should be optimized in accordance with the construction of a peripheral circuit of the node to which the residual charge compensation circuit according to the invention should be connected.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A residual charge compensation circuit connected to circuit means, said circuit means having a node which is coupled to a power supply and in which a residual charge of a first polarity tends to remain stored on said node when said power supply is turned off, comprising:

charge storage means for storing a compensating charge of a second polarity opposite said first polarity; and means for supplying the compensating charge to said node at a time of a turning-off of power supply.

2. A residual charge compensation circuit connected to circuit means, said circuit means having a first node which is coupled to a power supply and in which a residual charge of a first polarity tends to remain stored on said first node when said power supply is turned off, comprising:

a second node;

charge supply means for supplying a charge of a second polarity opposite said first polarity to said second node at a time of the turn-off of said power supply; and means for supplying the charge stored on said second node to said first node at a time of the turn-off of said power supply.

3. A residual charge compensation circuit connected to circuit means, said circuit means having a first node which is coupled to a power supply and in which a residual charge of a first polarity tends to remain stored on said first node when said power supply is turned off, comprising:

a second node;

charge supply means for supplying a charge of a second polarity opposite said first polarity to said second node at a time of the turn-off of said power supply; and means for establishing a current flow path between said first and second nodes at a time of the turn-off of said power supply.

4. The residual charge compensation circuit according to claim 3, wherein said charge supply means includes capacity coupling means connected between said power supply and said second node for supplying said charges of said second polarity to said second node in response to a change of said supply voltage at the power-off; and said establishing means includes switching means connected between said first and second nodes for rendering conductive in response to the change of a the potential of said second node.

5. The residual charge compensation circuit according to claim 4, wherein said switching means includes a first field effect semiconductor element having a control terminal connected to a reference potential source, a first conductor terminal connected to said first node, and a second conductor terminal; and said charge supply means further includes a second field effect semiconductor element having first conductor terminal connected to said second node, a second conductor terminal connected to said reference potential source, and a control terminal connected to said second node.

6. The residual charge compensation circuit according to claim 5, wherein said circuit means includes a power-on reset pulse generating circuit for generating a reset pulse for resetting other circuit means in response to said power-on.

7. The residual charge compensation circuit according to claim 6, wherein said power-on reset pulse generating circuit includes:

a third node;

a second capacity coupling element connected between said power supply and said third node;

flip-flop means provided between said first and third nodes;

a third capacity coupling element connected between said first node and a predetermined low potential source;

first inverting means for inverting the potential at said first node; and potential forcing means for forcing the potential at said third node to a predetermined potential in response to a rise of an output from said first inverter means.

8. The residual charge compensation circuit according to claim 7, wherein said flip-flop means includes second inverting means for inverting the potential at said third node and applying the inverted potential to said first node, and third inverting means for inverting the potential at said first node and applying the inverted potential to said third node; and said potential forcing means includes a third field effect semiconductor element having a first conductor terminal connected to said third node, a second conductor terminal connected to a predetermined potential source, and a control terminal receiving an output from said first inverting means.

9. The residual charge compensation circuit according to claim 8, wherein said power-on reset pulse generator circuit further includes:

delay means provided between said control terminal of said third field effect semiconductor element and an output terminal of said first inverting means, for transmitting a rise of an output voltage of said first inverting means to said control terminal of said third field effect semiconductor element at a delay of a predetermined time;

fourth inverting means for inverting an output from said first inverting means;

a fourth capacity coupling element provided between said control terminal of said third field effect semiconductor element and said predetermined potential source; and a fourth field effect semiconductor element having a first conductor terminal connected to said control terminal of said third field effect semiconductor element, a second conductor terminal connected to said predetermined potential source, and a control terminal receiving an output from said fourth inverting means.

10. The residual charge compensation circuit according to claim 9, wherein said delay means includes a fifth field effect semiconductor element having two conductor terminals and a control terminal, said control terminal connected to one of said two conductor terminals.

11. The circuit of claim 2, wherein said charge supplied by said charge supplying means has a magnitude substantially equal to said residual charge.

12. The circuit of claim 2, wherein said charge supplied by said charge supplying means has a magnitude greater than said residual charge.

13. The residual charge compensation circuit according to claim 5, wherein a polarity of said first and second field effect semiconductor elements is N-type, and said reference potential source comprises a low potential source.

14. The residual charge compensation circuit according to claim 8, wherein said third field effect semiconductor element has a polarity of N-type.

15. The residual charge compensation circuit according to claim 9, wherein said fourth field effect semiconductor element has a polarity of N-type.

16. The residual charge compensation circuit according to claim 10, wherein a polarity of said fifth field effect semiconductor element is N-type.

17. A semiconductor memory device connected to circuit means coupled to a power supply for removing charges remaining in said circuit means when said power supply is turned off, comprising:
a reference potential source;
a first field effect semiconductor element having a control terminal connected to said reference potential source, a first conductor terminal connected to said circuit means, and a second conductor terminal;
a second field effect semiconductor element having a first conductor terminal connected to said second conductor terminal of said first field effect semiconductor element, a second conductor terminal connected to said reference potential source, and a control terminal; and
a capacitor element connected between said power supply and said control terminal of said second field effect semiconductor element, wherein
said first conductor terminal and said control terminal of said second field effect semiconductor element are interconnected.

18. The semiconductor integrated circuit device according to claim 17, wherein said circuit means includes a power-on reset pulse generating circuit for generating a reset pulse for resetting other circuit means in response to said power-on.

19. The semiconductor integrated circuit device according to claim 17, wherein a polarity of said first and second field effect semiconductor elements is N-type, and said reference potential source comprising a low potential source.

20. A power-on reset circuit for supplying a reset signal in response to application of operating power for resetting other circuitry, comprising:
first detecting means for detecting application of operating power to a power supply terminal;
a first charge storage element;
means responsive to said application of operating power detected by said first detecting means for causing the output of said first charge storage element to attain a first logic level;
buffer circuit means for supplying an output of said first charge storage element as an output signal;
delay means responsive to said output of said first charge storage element for generating a control signal upon elapse of a particular time duration following attainment of said output of said first charge storage element at said first reference potential;
switching means responsive to said control signal for causing the output of said first storage element to attain a second logic level;
whereby said output signal is maintained at the first logic level for a time duration corresponding to said particular time duration following application of operating power to said power supply terminal;
and wherein residual charge on said first charge storage element tends to cause said time duration to be less than said particular time duration;
second means for detecting a turning off of operating power applied to said power supply terminal, and compensation means responsive to said turning off of operating power, detected by said second detecting means for supplying to said first charge storage element a compensating charge having a polarity opposite that of said residual charge for residual charge compensation.

21. The apparatus of claim 20, wherein said compensation means includes a second charge storage element, and means for supplying said compensating charge to said second charge storage element.

22. The apparatus of claim 21, wherein said compensation means includes means for electrically interconnecting said first and second charge storage elements.

23. A power-on reset signal generating circuit, comprising
latch means having a first node and a second node, the first node of said latch means receiving a supply potential,
a capacitance connected to the second node of said latch means,
an inverting means having an input node and an output node, the input node of said inverting means connected to one of said first and second nodes of said latch means, the output node of said inverting means providing a reset signal,
a switching means connected between the first node of said latch means and a ground potential node,
a control means for controlling said switching means to be in a conductive state during a predetermined period from a time of applying said supply potential to said first node of said latch means, and
means for discharging the potential of the second node of said latch means, when said supply potential is not applied to said first node of said latch means, said discharging means including charge supply means for supplying to said second node of said latch means a charge of a polarity opposite a polarity of charge stored on said second node and connecting means for connecting the second node of said latch means to said charge supply means at the time said supply potential is not applied to said first node.

24. The residual charge compensation circuit according to claim 1, wherein said residual charge compensation circuit and said circuit means are constructed on the same semiconductor substrate.

25. The residual charge compensation circuit according to claim 2, wherein said residual charge compensation circuit and said circuit means are constructed on the same semiconductor substrate.

26. The residual charge compensation circuit according to claim 3, wherein said residual charge compensation circuit and said circuit means are constructed on the same semiconductor substrate.

27. A method of compensating residual charge in a circuit means, said circuit means having a first node which is coupled to a power supply and in which a residual charge of a first polarity tends to remain stored on a node when said power supply is turned off, comprising the steps of:
storing a compensating charge of a second polarity opposite said first polarity; and
supplying the compensating charge to said node at a time of a turning-off of said power supply.

28. A method of compensating residual charge in a circuit means, said circuit means having a first node which is coupled to a power supply and in which a residual charge of a first polarity tends to remain stored on a node when said power supply is turned off, comprising the steps of:

storing a compensating charge having a magnitude greater than that of said residual charge and of a second polarity opposite said first polarity; and supplying the compensating charge to said node at a time of a turning-off said power supply.

29. An operation method of a semiconductor integrated circuit device connected to a circuit means having a first node in which charges of a first polarity remain when a power supply is turned off, comprising the steps of:

supplying charges of a second polarity opposite to said first polarity to a second node in response to the turn-off of said power supply; and electrically interconnecting said first and second nodes in response to the turn-off of said power supply.

* * * * *